(12) United States Patent
Aoyama et al.

(10) Patent No.: US 6,198,671 B1
(45) Date of Patent: Mar. 6, 2001

(54) SEMICONDUCTOR MEMORY DEVICE

(75) Inventors: Yasuhiro Aoyama, Tokyo; Kazuhiko Shimakawa; Kiyoto Ohta, both of Osaka; Masanobu Hirose, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/506,102

(22) Filed: Feb. 17, 2000

(30) Foreign Application Priority Data

Feb. 18, 1999 (JP) .................................................. 11-039923

(51) Int. Cl.$^7$ ........................................................ G11C 7/00
(52) U.S. Cl. ............... 365/189.09; 365/226; 365/230.06; 365/189.11
(58) Field of Search ................................ 365/189.09, 226, 365/230.06, 189.11

(56) References Cited

U.S. PATENT DOCUMENTS

| | | | |
|---|---|---|---|
| 5,446,697 | * 8/1995 | Yoo et al. | 365/226 |
| 5,687,123 | 11/1997 | Hidaka et al. | 365/189.09 |
| 6,115,319 | * 9/2000 | Kinoshita et al. | 365/233 |
| 6,128,231 | * 10/2000 | Chung | 365/185.23 |

* cited by examiner

*Primary Examiner*—David Nelms
*Assistant Examiner*—Gene N. Auduong
(74) *Attorney, Agent, or Firm*—McDermott, Will & Emery

(57) ABSTRACT

The semiconductor memory device formed on a semiconductor substrate includes: a memory cell array having a plurality of memory cells formed at intersections between a plurality of word lines and a plurality of bit line pairs; a plurality of sense amplifiers each formed to correspond to each of the plurality of bit line pairs for amplifying a potential difference read on the bit line pair; and a low-level potential generation section for generating a low-level potential out of high-level and low-level potentials to be applied to the memory cells, the bit line pairs, and the sense amplifiers. The low-level potential generation section has: a ground potential generation part having a ground potential generation semiconductor element for generating as the low-level potential a first potential substantially equal to a ground potential; a threshold potential generation part having a threshold potential generation semiconductor element for generating as the low-level potential a second potential substantially equal to a threshold potential, and operating when a potential exceeding the threshold potential is applied; and a ground potential control part for controlling operation of the ground potential generation semiconductor element.

15 Claims, 18 Drawing Sheets

SEMICONDUCTOR MEMORY DEVICE

BACKGROUND OF THE INVENTION

The present invention relates to a semiconductor memory device including a dynamic random access memory (DRAM) and, more particularly, to a semiconductor memory device having a function of switching a low-level potential to be applied to memory cell arrays, bit lines, and sense amplifiers depending on internal operation of the memory.

In recent years, in an attempt of realizing higher integration and faster operation of semiconductor memory devices including DRAMs, further miniaturization of transistors and lowering of the operating supply voltage for the transistors have been pursued. In DRAMs, in general, as the operating supply voltage is lowered, the amount of charges accumulated in a memory cell capacitor decreases, degrading the charge retention property of the memory cell. As transistors are miniaturized, the breakdown voltage of a gate oxide film decreases. It is therefore difficult to maintain the reliability of memory cell transistors as long as a conventional method in which the read potential of a memory cell is secured by raising the potential at a word line is employed. In recent years, also, there have been brought to market a type of semiconductor devices, called custom LSIs, where large-capacity memories such as DRAMs and custom logics such as CPUs or ASICs are integrated on one chip. To meet these trends, demands for designs using no internal boosted potential and process simplification by such designs have increased.

However, in order to retain the read potential of a memory cell without boosting a word line at the same level as that obtained by boosting the word line, the threshold potential of the memory cell transistor must be lowered. Lowering the threshold potential increases a sub-threshold leak current of the memory cell transistor. This also results in degradation of the charge retention property. As one conventional method that solves the above problem, a so-called boosted sense ground (BSG) method disclosed in U.S. Pat. No. 5,687,123 is known.

The circuit configuration and operation in the conventional boosted sense ground method will be described with reference to relevant drawings.

FIG. 16 is a partial circuit diagram showing the connection between a memory cell in the inactivated state and an activated sense amplifier in a DRAM. Referring to FIG. 16, a memory cell 500 includes: a memory cell capacitor 501; and a memory cell transistor 502 having a gate connected to a word line WL, a drain connected to a bit complementary line /BL, and a source connected to one electrode of the memory cell capacitor 501. An internally generated cell plate potential VCP is applied to the other electrode of the memory cell capacitor 501, and an internally generated substrate potential VBB is applied to the memory cell transistor 502.

A sense amplifier 510 has a cross-coupled structure including: a first inverter 511 composed of a first n-type transistor 511n and a first p-type transistor 511p; and a second inverter 512 composed of a second n-type transistor 512n and a second p-type transistor 512p. One output of the structure, namely, the common drain of the first n-type transistor 511n and the first p-type transistor 511p is connected to the bit complementary line /BL, while the other output, namely, the common drain of the second n-type transistor 512n and the second p-type transistor 512p is connected to a bit line BL. The sources of the first n-type transistor 511n and the second n-type transistor 512n are connected to a sense amplifier (SA) ground potential line SAN, while the sources of the first p-type transistor 511p and the second p-type transistor 512p are connected to a sense amplifier (SA) supply potential line SAP.

FIG. 17 shows a circuit configuration in the boosted sense ground method. An internal circuit 550 of a DRAM includes sense amplifiers and memory cells. The line for the ground potential in the internal circuit 560 is connected to a BSG potential line 560, which is connected with a BSG driver 570. The BSG driver 570 includes: a first NMOS transistor 571 having a diode-connected gate and a grounded source; and a second NMOS transistor 572 having a gate receiving a control signal $\phi$ and a grounded source. The two NOMS transistors have a common drain. The BSG potential line 560 is also connected with a BSG potential compensation circuit 580 that supplies a current to the BSG potential line 560 when the BSG potential falls below a predetermined value.

The operation of the above DRAM employing the boosted sense ground method is as follows.

FIGS. 18(a) and 18(b) show waveforms of the SA ground potential SAN and the SA supply potential SAP during read operation by a sense amplifier, observed when the boosted sense ground method is not employed and when it is employed, respectively. In FIGS. 18(a) and 18(b), times tc and td represent the drive timings of the word line WL and the sense amplifier, respectively.

As is observed from FIG. 18(b), when the boosted sense ground method is employed, the ground potential for sense amplifiers, namely, the BSG potential is kept above the threshold voltage of the first NMOS transistor 571 of the BSG driver 570 shown in FIG. 17 due to the clamping function of the transistor until time td at which the sense amplifier is activated.

At time td, the second NMOS transistor 572 shown in FIG. 17 is turned ON in response to the control signal $\phi$ and kept ON until time tn. This suppresses the BSG potential from rising due to a current flowing from the sense amplifier.

In the boosted sense ground method, therefore, the potential at the bit complementary line /BL, which is the one of the bit line pair having the lower potential, is higher than the ground potential VSS. This increases a first bias voltage VGS1, namely, a gate-drain voltage of the memory cell transistor 502 shown in FIG. 16, compared with the case shown in FIG. 18(a) where the boosted sense ground method is not employed. As the value of the first bias voltage VGS1 is greater, a sub-threshold leak current flowing toward the channel of the memory cell transistor 502 in the inactivated state becomes smaller exponentially. The sub-threshold leak current normally flows in such a direction that data retained in the memory cell capacitor 501 shown in FIG. 16 may be destructed. However, by setting the BSG potential at a level higher than the ground potential VSS to secure a large value for the first bias voltage VGS1, such a sub-threshold leak current can be reduced. The reduction of the sub-threshold leak current contributes to improving the charge retention property of the DRAM.

However, the semiconductor memory device employing the conventional boosted sense ground method has the following problem. In this method, the SA ground potential SAN for the sense amplifier 510 shown in FIG. 16 is kept higher than the ground potential VSS by the value of the threshold potential of the first NMOS transistor 571 shown in FIG. 17. Accordingly, the value of a second bias voltage VGS2 that is a source-gate voltage of the first n-type transistor 511n shown in FIG. 16 is smaller than the case shown in FIG. 18(a) where the SA ground potential SAN is not boosted.

The second bias voltage VGS2 is a bias voltage from the source toward the gate of the first n-type transistor 511n of the sense amplifier 510. If this voltage value is small, the first n-type transistor 511n degrades in its current drive ability and thus in its ability of approximating the bit complementary line /BL to the SA ground potential SAN. As a result, the speed at which a sufficient potential is generated between the bit line pair BL, /BL, called a sense speed, decreases.

The second bias voltage VGS2 also decreases when the supply voltage is lowered to realize lowering of the operating voltage of DRAMs. Therefore, the problem of reduction in sense speed is specifically significant in DRAMs. If the supply voltage is extremely low, the second bias voltage VGS2 does not exceed the threshold value of the first n-type transistor 511n of the sense amplifier 510 even at time td at which the sense amplifier is activated. As a result, the sense amplifier 510 fails to perform a desired operation.

In other words, in order to allow the sense amplifier 510 to perform its operation, a precharge potential VBP for the bit line pair BL, /BL must be equal to or more than the sum of the BSG potential and the threshold potential VTN of the first n-type transistor 511n. For example, in the case of FIG. 18(b), when the BSG potential is 0.5 V and the threshold potential VTN is 0.6 V, the lower limit of the precharge potential VBP is 1.1 V. Assume that the precharge potential VBP is a half of the supply potential VDD, the operational lower limit voltage of DRAMs is 2.2 V.

In the case of FIG. 18(a) where a low potential SG for sense amplifier is short-circuited with the ground potential VSS, the lower limit of the precharge potential VBP is 0.6 V. Thus, the operational lower limit voltage of DRAMs is 1.2 V. This indicates that lowering of the supply voltage is actually impossible by adopting the boosted sense ground method since the operational lower limit voltage of DRAMs employing this method is higher than that of DRAMs that do not employ this method.

Another problem is that, the BSG potential tends to be steadily lowered due to a leak current through the first NMOS transistor 571 and the second NMOS transistor 572 of the BSG driver 570 as shown in FIG. 17. In order to keep the BSG potential at a level higher than the ground potential VSS, therefore, continuous current supply from the BSG potential compensation circuit 580 is required. This increases power consumption of DRAMs.

SUMMARY OF THE INVENTION

An object of the present invention is providing a semiconductor memory device capable of maintaining the charge retention property of memory cells satisfyingly without reducing the sense speed while lowering the operational lower limit voltage.

In order to achieve the above object, the present invention provides a DRAM type semiconductor memory device having a function of switching the ground potential for sense amplifiers depending on the timing of the driving of the sense amplifiers.

Specifically, the semiconductor memory device of the present invention is formed on a semiconductor substrate, and comprises: a memory cell array having a plurality of memory cells formed at intersections between a plurality of word lines and a plurality of bit line pairs; a plurality of sense amplifiers each formed to correspond to each of the plurality of bit line pairs for amplifying a potential difference read on the bit line pair; and low-level potential generation means for generating a low-level potential, the low-level potential, along with a high-level potential, being applied to the memory cells, the bit line pairs, and the sense amplifiers, wherein the low-level potential generation means comprises: a ground potential generation part having a ground potential generation semiconductor element for generating as the low-level potential a first potential substantially equal to a ground potential; a threshold potential generation part for generating as the low-level potential a second potential substantially equal to a threshold potential, and operating when a potential exceeding the threshold potential is applied; and a ground potential control part for controlling operation of the ground potential generation semiconductor element.

In the semiconductor memory device of the present invention, in the case where each memory cell includes a capacitor for data retention and a switch transistor of which access to the bit line is controlled by the word line, the low-level potential at the memory cell connected to an inactivated word line is substantially equal to the threshold potential of the threshold potential generation semiconductor element that is a second potential higher than the ground potential. This increases the gate-drain voltage of the switch transistor when the switch transistor is OFF, thereby reducing a sub-threshold leak current of the memory cell. As a result, the charge retention property of the memory cell improves. In the case where each sense amplifier includes a transistor, the low-level potential at the sense amplifier is substantially equal to the ground potential that is the first potential. This increases the gate-source voltage of the transistor when the transistor is ON. As a result, the sense speed of the sense amplifier is prevented from decreasing and the operating lower limit voltage of the memory cell can be reduced.

In the semiconductor memory device of the present invention, preferably, the ground potential generation semiconductor element generates the first potential by being activated in response to a control signal from the ground potential control part and kept activated over a predetermined period starting from a time at which part of the plurality of sense amplifiers are activated, and the threshold potential generation semiconductor element generates the second potential during a period over which the ground potential generation semiconductor element is not activated.

With the above configuration, the low-level potential is substantially equal to the ground potential that is the first potential at the start of the operation of the externally selected sense amplifiers. This ensures that the gate-source voltage of the transistor of the sense amplifier increases when the transistor is ON.

In the semiconductor memory device of the present invention, preferably, the ground potential generation semiconductor element generates the first potential by being activated in response to a control signal from the ground potential control part and kept activated during a period over which the plurality of sense amplifiers are in the inactivated state and over a predetermined period starting from a time at which part of the plurality of sense amplifiers are activated, and the threshold potential generation semiconductor element generates the second potential during a period over which the ground potential generation semiconductor element is not activated.

With the above configuration, the low-level potential is set to the ground potential that is substantially equal to the first potential even when the sense amplifiers are in the inactivated state. This eliminates the necessity of providing means for generating the ground potential during the standby period of the memory and maintaining the ground potential. Moreover, current consumption of the low-level potential generation means can be suppressed. As a result, simplification of the device configuration and reduction of current consumption of the entire device are possible.

In the semiconductor memory device of the present invention, preferably, the low-level potential generation means further includes: a reference potential generation part for generating a reference potential that is substantially equal to the threshold potential; and a potential compensation part for compensating the low-level potential by supplying a current so that the low-level potential is higher than the reference potential, wherein the reference potential generation part and the potential compensation part operate during a period over which the ground potential generation part is not activated.

With the above configuration, the reference potential generation part and the potential compensation part are inactivated when the low-level potential is used as the ground potential. This significantly reduces power consumption required for the driving of the low-level potential.

In the above case, preferably, the ground potential generation part shifts from the activated state to the inactivated state when the potential at the low-potential bit line out of the bit line pair connected to an activated sense amplifier among the plurality of sense amplifiers is higher than the low-level potential.

Normally, when a sense amplifier is in the inactivated state, the bit pair connected to the sense amplifier have been precharged to a level about a half of the supply potential. Therefore, if the ground potential generation part shifts from the activated state to the inactivated state when the potential at the low-potential bit line out of the bit line pair connected to an activated sense amplifier is higher than the low-level potential as stated above, a current flows from the activated low-potential bit line to the low-level potential line. This makes it possible to reduce the current amount to be supplied. from the potential compensation part for raising the low-level potential to the threshold potential, ensuring reduction in current consumption of the potential compensation part.

In the above case, preferably, the potential compensation part includes current supply ability switching means for switching the current supply ability of the potential compensation part depending on the memory capacity of the memory cell array.

With the above configuration, the current supply ability of the potential compensation part can be changed for each memory capacity of the memory device. This makes it possible to optimize the ability of compensating (precharging) the low-level potential even in the case where the capacity of the low-level potential line varies depending on the memory capacity. As a result, increase in power consumption can be suppressed.

In the above case, preferably, the potential compensation part includes current supply ability switching means for switching the current supply ability of the potential compensation part depending on the number of sense amplifiers activated at one operation timing.

With the above configuration, since the current supply ability of the potential compensation part can be selected depending on the number of sense amplifiers activated at one operation timing, the rise speed of the low-level potential is prevented from becoming slow even when the number of sense amplifier activated at one operation timing is small. Therefore, improvement of the potential retaining property of the memory cell is ensured.

In the semiconductor memory device of the present invention, preferably, the low-level potential generation means further includes: a reference potential generation part for generating a reference potential substantially twice as large as the threshold potential; and a potential compensation part for compensating the low-level potential by supplying a current so that the low-level potential is substantially equal to the threshold potential, wherein the potential compensation part includes a field effect transistor having a gate receiving the reference potential, a drain receiving a current from the potential compensation part, and a source outputting the low-level potential.

With the above configuration, detection of the low-level potential and adjustment of the current supply amount for raising the low-level potential can be carried out by one transistor, causing no occurrence of propagation delay from the detection of the low-level potential to the current supply. This makes it possible to reduce the precharge current for precharging the low-level potential to a compensated potential. Also, since the precharge current changes in correspondence with the low-level potential in an analog fashion, a change in the low-level potential can be suppressed and thus an occurrence of a variation in the charge amount accumulated in memory cells is reduced.

In the above case, preferably, the ground potential generation part shifts from the activated state to the inactivated state when the potential at the low-potential bit line out of the bit line pair connected to an activated sense amplifier among the plurality of sense amplifiers is higher than the low-level potential.

With the above configuration, since a current flows to the low-level potential line from the activated bit line, the current amount supplied from the potential compensation part for raising the low-level potential to the threshold potential can be reduced, ensuring reduction of current consumption of the potential compensation part.

In the above case, preferably, the potential compensation part includes current supply ability switching means for switching the current supply ability of the potential compensation part depending on the memory capacity of the memory cell array.

Alternatively, preferably, the potential compensation part includes current supply ability switching means for switching the current supply ability of the potential compensation part depending on the number of sense amplifiers activated at one operation timing.

In the semiconductor memory device of the present invention, the threshold potential generation semiconductor element includes a first semiconductor element and a second semiconductor element, and the low-level potential generation means includes: a potential compensation part for compensating the low-level potential by supplying a current so that the low-level potential is higher than the ground potential; and threshold potential generation semiconductor element selection means for selecting the first semiconductor element or the second semiconductor element in response to a control signal from the ground potential control part.

With the above configuration, either the first semiconductor element or the second semiconductor element can be selected to raise the low-level potential higher than the ground potential depending on the period during which a large current flows to the sense amplifiers and the period during which no large current flows. Thus, by using a comparatively large-size semiconductor element when a large current flows to the sense amplifiers, excessive rise of the low-level potential can be suppressed. By using a comparatively small-size semiconductor element when no large current flows, lowering of the low-level potential due to a leak current can be suppressed, reducing power consumption of the potential compensation part.

In the above case, preferably, the second semiconductor element is smaller in size than the first semiconductor element, and the threshold potential generation semiconductor element selection means selects an output from the first semiconductor element during a given period starting from a time at which part of the plurality of sense amplifiers are activated, and selects an output from the second semiconductor element after lapse of the given period.

With the above configuration, the low-level potential is generated by the first semiconductor element having a larger size during the period over which a large current flows to the sense amplifiers and the period over which the low-level potential is substantially equal to the ground potential. This suppresses excessive rise of the low-level potential. During the period over which part of the plurality of sense amplifiers are in the activated state and no large current does not flow, the second semiconductor element having a smaller size is used. This suppresses lowering of the low-level potential due to a leak current.

In the semiconductor memory device of the present invention, preferably, a plural number of the memory cell arrays are arranged, a plurality of sense amplifier columns each including the plurality of sense amplifiers are placed so that the plurality of sense amplifiers are located along the sides of the plurality of memory cell arrays parallel to a direction in which the word lines extend, the plurality of memory cell arrays and the plurality of sense amplifier columns constitute a memory core block, and the low-level potential generation means are placed along both sides of the memory core block parallel to a direction in which the plurality of sense amplifier columns extend.

With the above configuration, the average distance between the low-level potential generation means and the sense amplifier column is halved compared with the case where the low-level potential generation means is placed on either one side. Moreover, currents from the sense amplifiers flow to the two low-level potential generation means on both sides, enabling to reduce the effective resistance values of the low-level potential generation means and the sense amplifiers. As a result, decrease in the sense speed caused by voltage drop due to line resistance is suppressed, and an occurrence of a variation in the operation properties of the sense amplifiers activated simultaneously is reduced, stabilizing the read and write operations of the memory device.

In the above case, preferably, the ground potential generation semiconductor element, the threshold potential generation semiconductor element, and semiconductor elements in the sense amplifier columns are formed in a common continuous well formed in the semiconductor substrate.

In the case where semiconductor elements (transistors) are formed in wells having different conductivities, they must be placed with a predetermined space therebetween to avoid a problem such as latch-up. This is not necessary in the above common well structure. Thus, the circuit integration improves.

DESCRIPTION OF THE PREFERRED EMBODIMENTS

First, the semiconductor memory device according to the present invention will be summarized as follows with reference FIG. 1.

Figure 1:
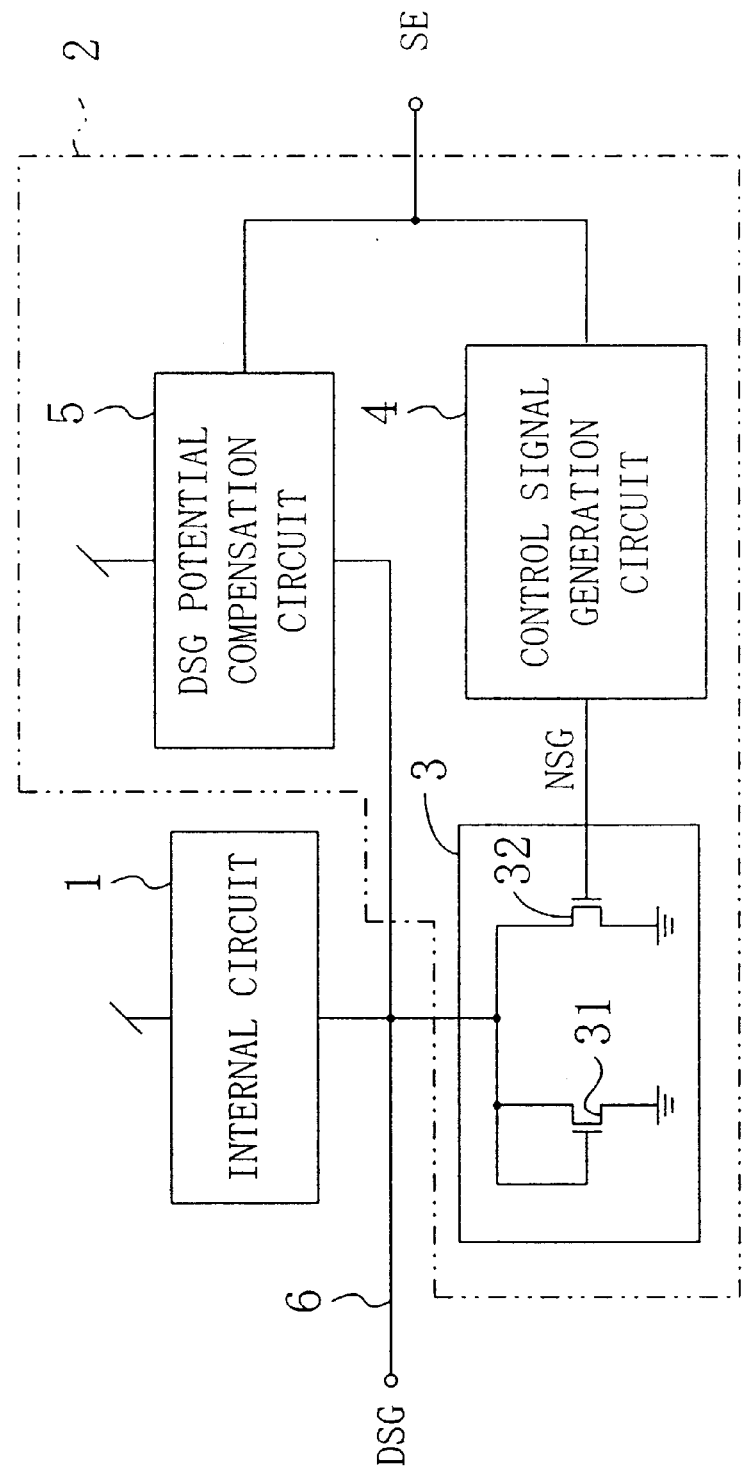
FIG. 1 is a functional block diagram of a semiconductor memory device for explanation of a dynamic sense ground method according to the present invention.

FIG. 1 shows a functional construction of a DRAM as the semiconductor memory device according to the present invention for realizing a dynamic sense ground (DSG) method. Referring to FIG. 1, the DRAM includes an internal circuit 1 having sense amplifiers, memory cells, and the like, and a low-level potential generation section 2. The low-level potential generation section 2 includes a DSG driver 3 as the ground potential generation part and the threshold potential generation part, a control signal generation circuit 4 as the ground potential control part, and a DSG potential compensation circuit 5 as the potential compensation part.

The line for the ground potential inside the internal circuit 1 is connected to a DSG potential line 6, which is connected with the DSG driver 3 and the DSG potential compensation circuit 5.

The DSG driver 3 includes: a first NMOS transistor 31 having a diode-connected gate and a grounded source; and a second NMOS transistor 32 having a gate receiving an internal control signal NSG supplied from the control signal generation circuit 4 and a grounded source. The two NMOS transistors have a common drain.

The control signal generation circuit 4 receives a sense amplifier (SA) drive signal SE and outputs the internal control signal NSG by adding a predetermined delay to the SA drive signal SE.

The DSG driver 3 sets the DSG potential to the ground potential (first potential) during precharging of the DRAM and during a predetermined period immediately after activation of the SA drive signal SE. The DSG potential is then raised by a current supplied from the DSG potential compensation circuit 5 and a current discharged from the sense amplifiers, so that the DSG potential is clamped close to a threshold potential VTN (second potential) of the first NMOS transistor 31 during the activation of the sense amplifiers.

Figure 16:
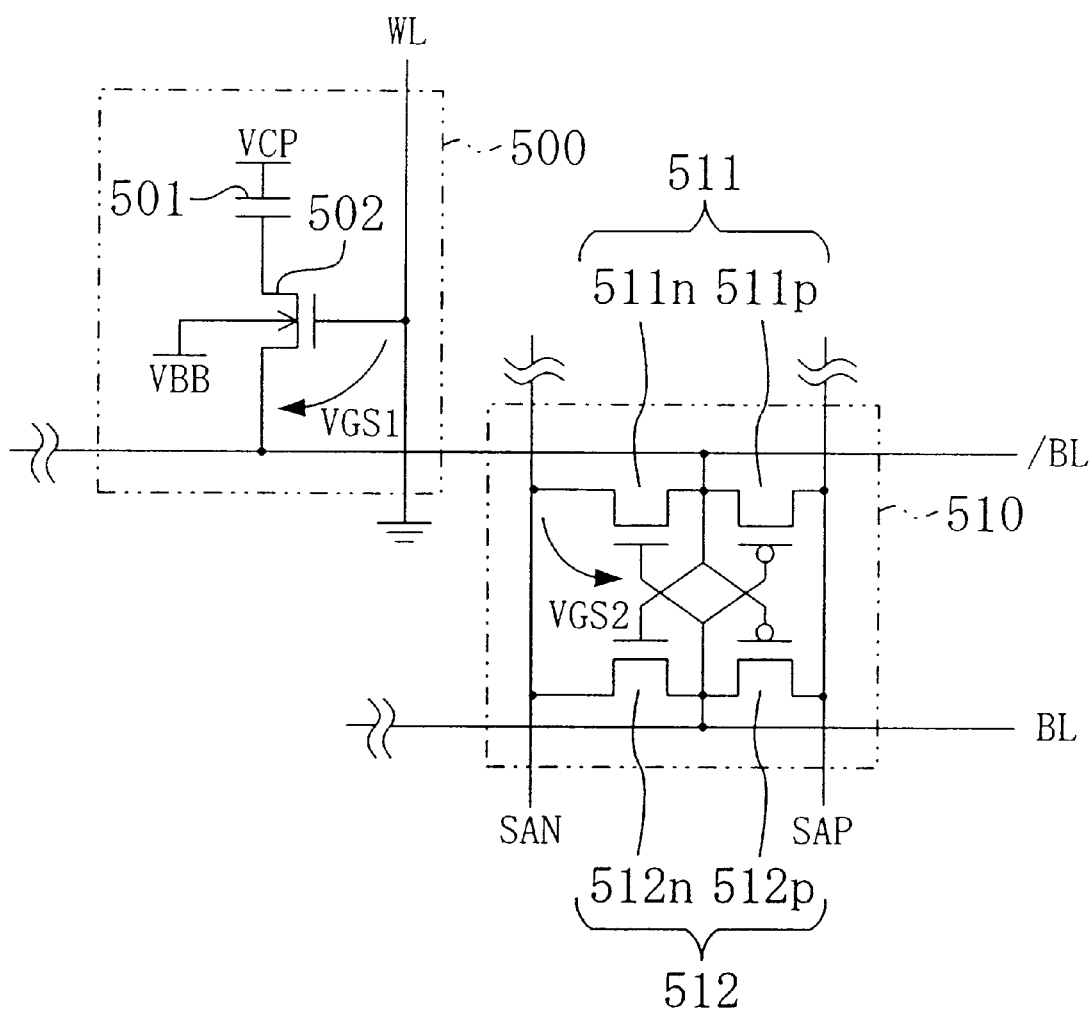
FIG. 16 is a partial circuit diagram showing the connection between a memory cell in the inactivated state and an activated sense amplifier of a typical DRAM.
Figure 17:
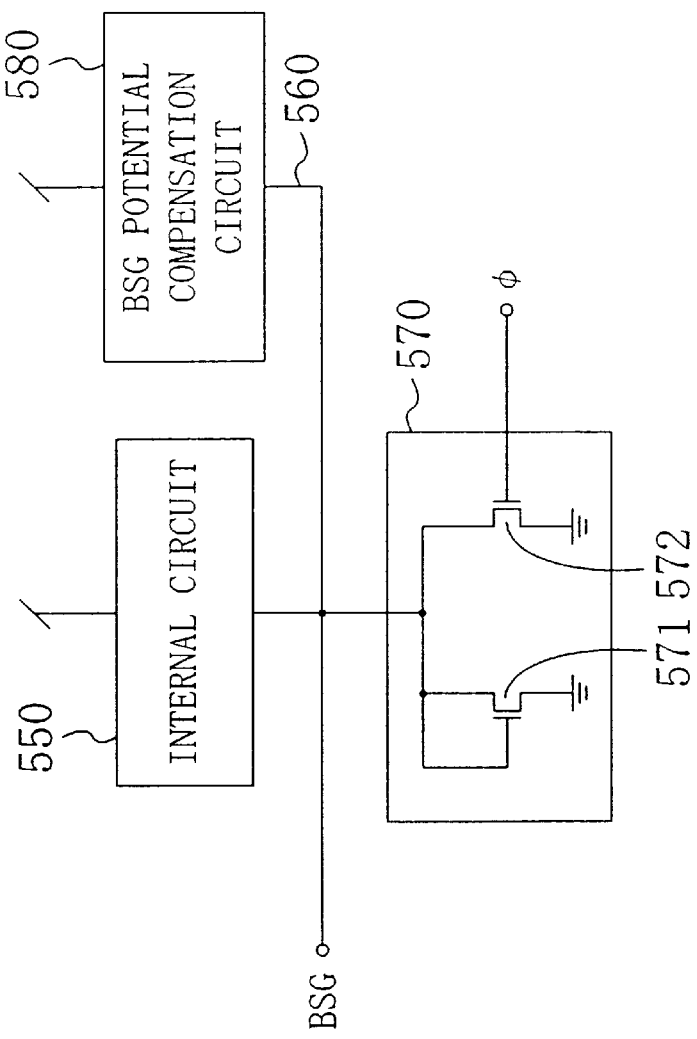
FIG. 17 is a functional block diagram of a DRAM for explanation of the conventional boosted sense ground method.
Figure 18A:
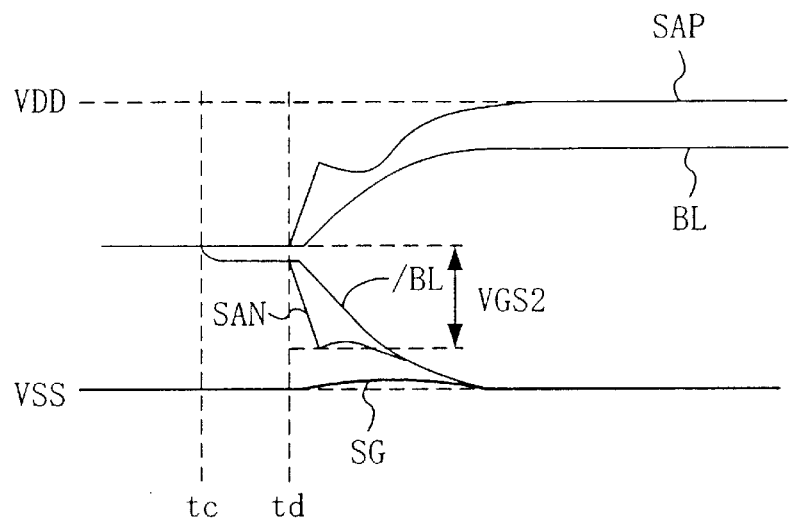
FIGS. 18(a) and 18(b) show potential waveforms representing changes in a bit pair, an SA ground potential SAN, and an SA supply potential SAP during read operation by a sense amplifier when the boosted sense ground method is not employed and when it is not employed, respectively.
Figure 18B:
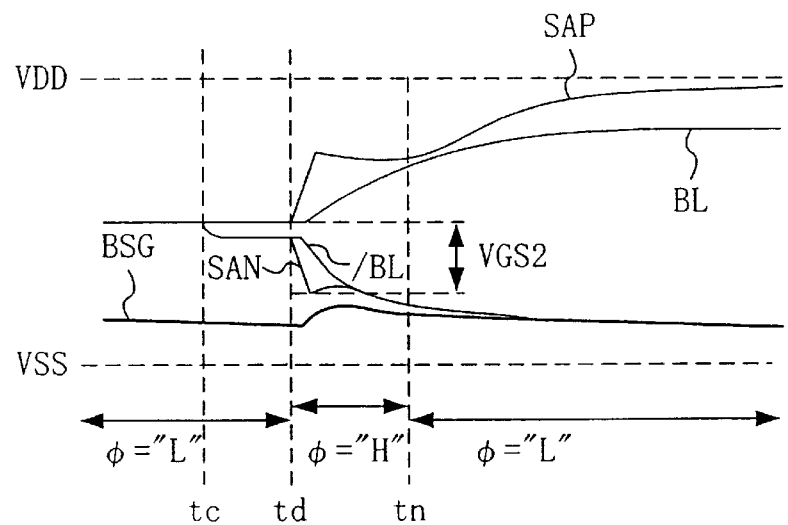

Thus, in the DSG method of the present invention, the low-level potential during a predetermined period from the start of operation of the sense amplifier is set to the ground potential. This enables a sufficiently large value to be secured for the second bias voltage VGS2 during the activation of the sense amplifier 510 shown in FIG. 16 and thus the sense speed to be improved.

After the lapse of a predetermined period from the activation of the SA drive signal SE, the DSG potential is raised by a current supplied from the DSG potential compensation circuit 5 and a current discharged from the sense amplifier. This increases the first bias voltage VGS1 at the memory cell 500 in the OFF state shown in FIG. 16, and thus improves the charge retention property of the memory cell. The predetermined period mentioned above is made short. That is, the timing difference between the SA drive signal SE and the internal control signal NSG is made small, so that the low-level potential of the bit line is prevented from largely falling below the proximity of the threshold potential VTN during the activation of the sense amplifier. This also improves the charge retention property as in the conventional boosted sense ground method.

The DSG potential compensation circuit 5 supplies a current when necessary so that the DSG potential is kept at a predetermined value higher than the ground potential during the activation of the sense amplifier, while it stops the current supply operation so as to set the DSG potential at the ground potential during inactivation of the sense amplifier. This greatly reduces the power consumed by the driving of the DSG potential compared with the conventional boosted sense ground method.

Hereinafter, preferred embodiments of the DRAM type semiconductor memory device employing the DSG method according to the present invention will be described with reference to the relevant drawings.

EMBODIMENT 1

Figure 2:
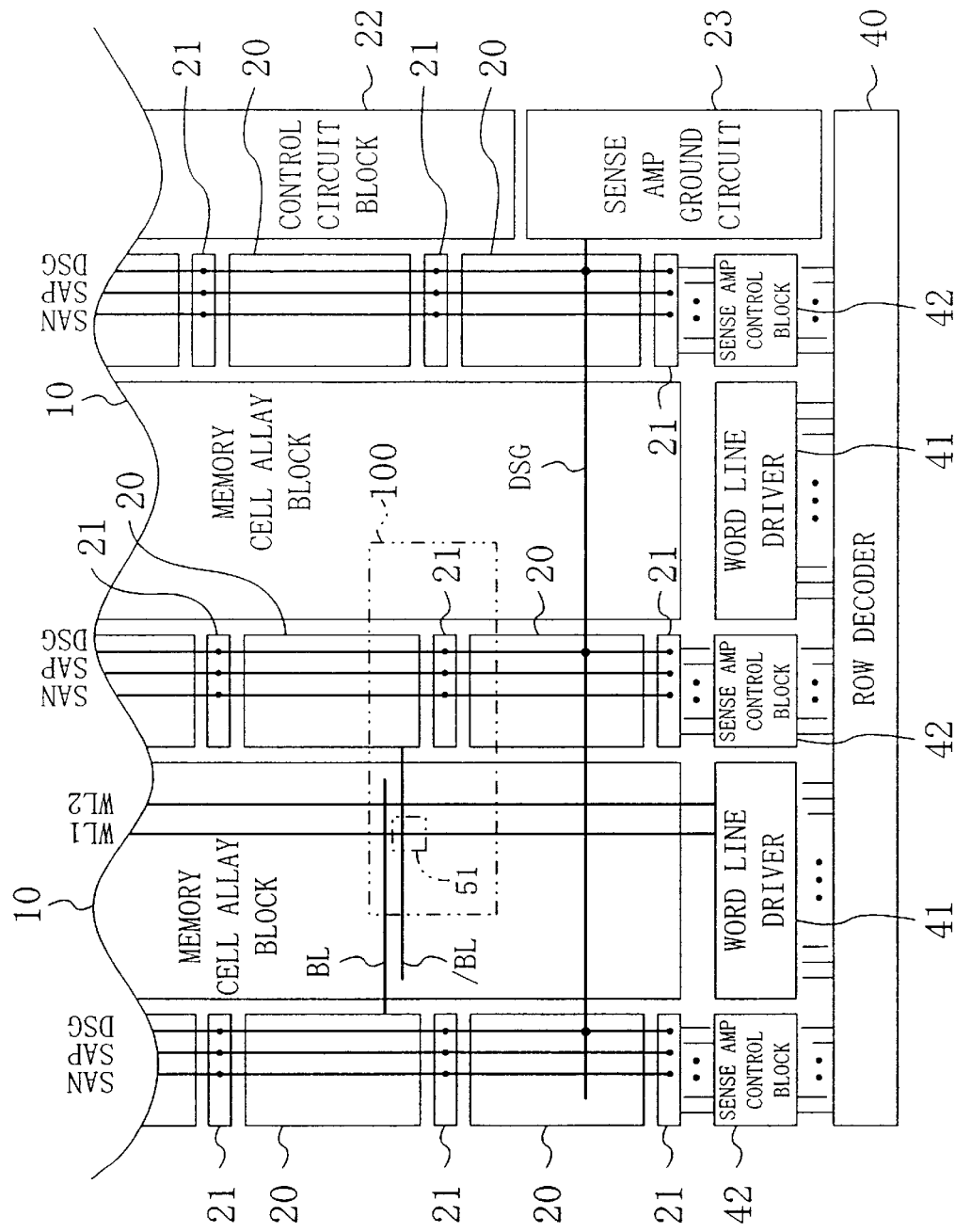
FIG. 2 is a partial block diagram of a semiconductor memory device of EMBODIMENT 1 according to the present invention.

FIG. 2 is a block diagram of a DRAM chip as the semiconductor memory device of EMBODIMENT 1 according to the present invention. Referring to FIG. 2, the DRAM chip includes: a plurality of memory cell array blocks 10 each having a plurality of memory cells that retain respective charges to be used as data; and a plurality of sense amplifier blocks 20 and a plurality of sense amplifier drivers 21 for driving the sense amplifiers in the sense amplifier blocks 20, which are both placed along opposite sides of the respective memory cell array blocks 10 parallel to the direction in which word lines WL extend.

On the other side of the columns of the sense amplifier blocks 20 and the sense amplifier drivers 21 with respect to the memory cell array blocks 10 are selectively formed columns of control circuit blocks 22 composed of column decoders and the like and sense amplifier ground circuits 23 as the low-level potential generation section 2.

The sense amplifier ground circuits 23 supply a dynamic sense amplifier ground (DSG) potential to the sense amplifier drivers 21, which in turn supply an SA supply potential SAP and an SA ground potential SAN to the adjacent sense amplifier blocks 20.

A row decoder 40 for decoding an externally input row address is placed on one peripheral end of the memory cell array blocks 10 in the direction in which the word lines extend. Between the memory cell array blocks 10 and the row decoder 40 are placed a plurality of word line drivers 41 and a plurality of sense amplifier control blocks 42. Each word line driver 41 receives a decode signal from the row decoder 40 and outputs the received decode signal to word lines WLn (n=1, 2, 3, . . . ). Each sense amplifier control block 42 receives the decode signal from the row decoder 40 to control the sense amplifier blocks 20 and the sense amplifier drivers 21 based on the received decode signal.

Each memory cell array block 10 includes a plurality of memory cells arranged in a matrix. A memory cell 51, for example, is formed at an intersection between a word line WL1 driven by the word line driver 41 and a bit complementary line /BL connected to the sense amplifier block 20.

Figure 3:
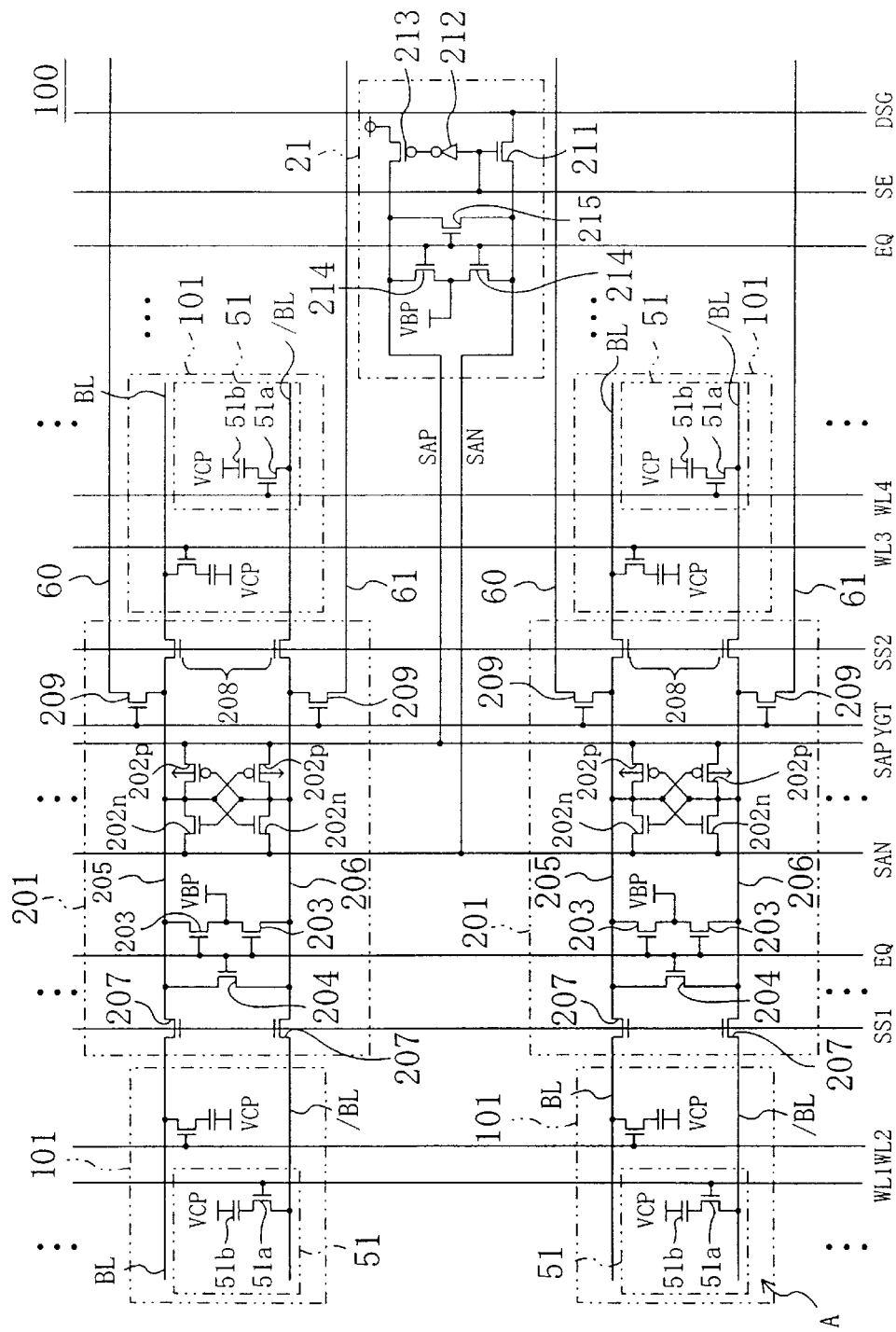
FIG. 3 is a circuit diagram of memory cell array blocks, sense amplifier blocks, and a sense amplifier driver of the semiconductor memory device of EMBODIMENT 1.

FIG. 3 shows a specific circuit configuration of an area 100 in FIG. 2 including the memory cell array blocks 10, the sense amplifier blocks 20, and the sense amplifier driver 21. Referring to FIG. 3, each memory cell array block 10 is composed of memory cell arrays 101 each including memory cells 51, bit line pairs BL, /BL, and word lines WLn, WLn+1.

Each memory cell 51 includes: a memory cell transistor 51a composed of an NMOS transistor having a drain connected to the bit line BL or the bit complementary line /BL and a gate connected to the word line WLn; and a memory cell capacitor 51b of which one electrode is connected to a cell plate potential VCP and the other electrode is connected to the source of the memory cell transistor 51a.

The sense amplifier block 20 is composed of sense amplifiers 201 each of which is a cross-coupled sense amplifier composed of two pairs of NMOS transistors 202n and PMOS transistors 202p. The cross-coupled sense amplifier receives an SA ground potential SAN via the sources of the NMOS transistors 202n and receives an SA supply potential SAP via the sources of the PMOS transistors 202p.

The sense amplifier 201 further includes: two precharge NMOS transistors 203 having a common drain connected to a precharge potential VBP and sources connected to a first internal line 205 and a second internal line 206, respectively; and an equalizing NMOS transistor 204 having a gate receiving an equalize signal EQ for equalizing the potentials at the bit line pair BL, /BL. In the sense amplifier 201, the first internal line 205 is connected to the bit line BL via first and second transfer transistors 207 and 208 as transfer gates, and the second internal line 206 is connected to the bit complementary line /BL via first and second transfer transistors 207 and 208 as transfer gates. The first transfer transistors 207 have respective gates receiving a first shared gate signal SS1, and the second transfer transistors 208 have respective gates receiving a second shared gate signal SS2. By selectively activating the first shared gate signal SS1 or the second shared gate signal SS2, either the bit pair BL, /BL on the side of the memory cell array 101 having the word line WL1 or those on the side of the memory cell array 101 having the word line WL3 are selected.

The first internal line 205 is connected to a first data line 60 via a third transfer transistor 209 having a gate receiving a YGT signal, and the second internal line 206 is connected to a second data line 61 via a third transfer transistor 209 having a gate receiving the YGT signal. The first and second data lines 60 and 61 are connected to a read or write circuit not shown.

The sense amplifier driver 21 includes: an NMOS switch transistor 211 having a gate receiving a sense amplifier (SA) drive signal SE for setting the SA ground potential SAN to the dynamic sense amplifier ground (DSG) potential; an inverter 212 for inverting the SA drive signal SE; a PMOS switch transistor 213 receiving the inverted SA drive signal SE for setting the SA supply potential SAP to the ground potential VDD of the device; two precharge NMOS transistors 214 having a common drain connected to a precharge potential VBP and sources connected to respective lines for SAP and SAN; and an equalizing NMOS transistor 215 having a gate receiving the equalizing signal EQ for equalizing the potentials at the lines for SAP and SAN.

The first and second shared gate signals SS1 and SS2, the equalizing signal EQ, the YGT signal, and the SA drive signal SE input into the sense amplifiers 201 and the sense amplifier drivers 21 are all supplied from the sense amplifier control blocks 42 shown in FIG. 2. A back-gate potential VBB of about −1.0 V is applied to a substrate of each NMOS transistor shown in FIG. 3 for reducing a sub-threshold leak current.

Figure 4:
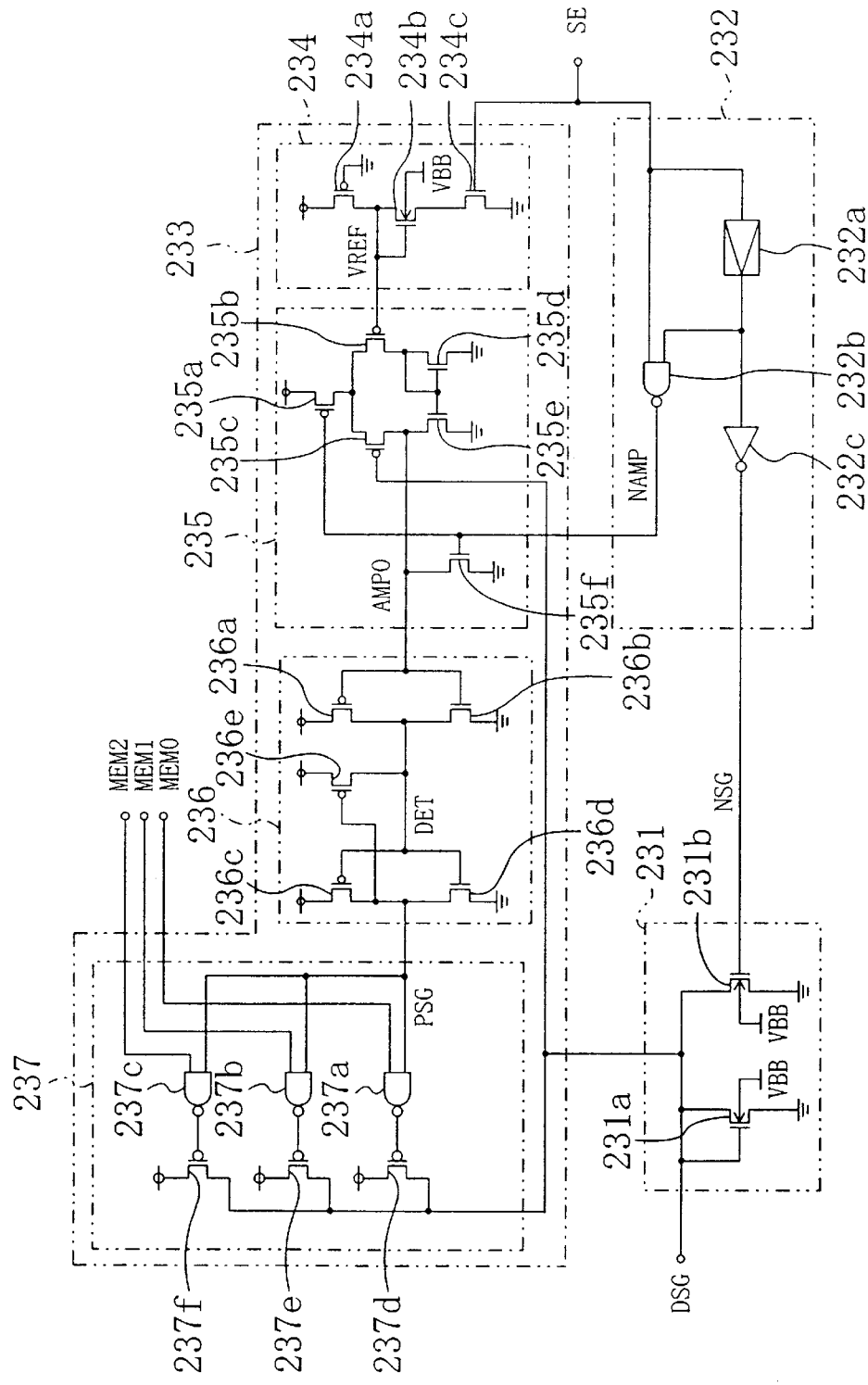
FIG. 4 is a circuit diagram of a sense amplifier ground circuit of the semiconductor memory device of EMBODIMENT 1.

FIG. 4 shows a specific circuit configuration of the sense amplifier ground circuit 23 shown in FIG. 2. Referring to FIG. 4, the sense amplifier ground circuit 23 includes: a DSG driver 231 as the ground potential generation part and the threshold potential generation part for driving the DSG potential; a control signal generation circuit 232 as the ground potential control part; and a DSG potential compensation circuit 233 as the potential compensation part.

The DSG potential compensation circuit 233 includes: a reference potential generation circuit 234 as the reference potential generation part for generating a reference potential VREF; a DSG level detection circuit 235 for detecting the difference between the DSG potential and the reference potential VREF; a Schmitt trigger 236 for providing the hysteresis characteristics for a control signal for boosting the DSG potential; and a DSG precharge circuit 237 as the current supply ability switching means for supplying a boosting current to the DSG driver 231 with the current supply ability thereof being switchable.

The DSG driver 231 includes: a first NMOS transistor 231a as the threshold potential generation semiconductor element having a gate and a drain commonly connected to an output terminal of the DSG potential (DSG node); and a second NMOS transistor 231b as the ground potential generation semiconductor element connected in parallel with the first NMOS transistor 231a for setting the DSG potential to the ground potential in response to the ground potential control signal NSG received from the control signal generation circuit 232.

The control signal generation circuit 232 includes: a delay circuit 232a receiving the SA drive signal SE to output a delay signal having a predetermined delay time, for example, about 1 ns, added to the SA drive signal SE; a NAND circuit 232b receiving the delay signal from the delay circuit 232a and the SA drive signal SE to output a detection circuit control signal NAMP for activating the DSG level detection circuit 235; and an inverter 232c receiving the delay signal from the delay circuit 232a to output the ground potential control signal NSG by inverting the received signal.

The reference potential generation circuit 234 includes: a PMOS transistor 234a as a current supply having a grounded gate, a source receiving the supply potential VDD, and a drain as an output terminal; a first NMOS transistor 234b having a gate and a drain commonly connected to the drain of the PMOS transistor 234a for generating and outputting the reference potential VREF; and a second NMOS transistor 234c having a drain connected to the source of the first NMOS transistor 234b, a gate receiving the SA drive signal SE, and a grounded source for controlling the generation of the reference potential VREF. The size of the PMOS transistor 234a is smaller than that of the first and second NMOS transistors 234b and 234c.

The DSG level detection circuit 235 includes a differential amplifier composed of: a PMOS transistor 235a as a current supply having a gate receiving the detection circuit control signal NAMP from the control signal generation circuit 232; a first drive PMOS transistor 235b having a source connected to the drain of the PMOS transistor 235a and a gate receiving the reference potential VREF; a second drive PMOS transistor 235c having a source connected to the drain of the PMOS transistor 235a and a gate receiving the DSG potential; a first NMOS transistor 235d having a gate and a drain commonly connected to the drain of the first drive PMOS transistor 235b and a grounded source; and a second NMOS transistor 235e having a gate shared with the first NMOS transistor 235d, a drain shared with the second drive PMOS transistor 235c, and a grounded source. The first and second NMOS transistors 235d and 235e constitute a so-called current-mirror circuit. A signal AMPO is output from the common drain of the second drive PMOS transistor 235c and the second NMOS transistor 235e. The DSG level detection circuit 235 further includes a third NMOS transistor 235f having a gate receiving the detection circuit control signal NAMP and setting the output signal AMPO to the low level when the received detection circuit control signal NAMP is HIGH, namely, when the differential amplifier is in the inactivated state.

The above differential amplifier serves as a comparator that detects the potential difference between the reference potential VREF and the DSG potential when it is activated in response to the low level of the detection circuit control signal NAMP, to output the comparison result as the output signal AMPO.

The Schmitt trigger 236 includes: a first inverter composed of a first PMOS transistor 236a and a first NMOS transistor 236b, receiving at the input terminal thereof the output signal AMPO from the DSG level detection circuit 235 and outputting a detection signal DET by inverting the polarity of the output signal AMPO; a second inverter composed of a second PMOS transistor 236c and a second NMOS transistor 236d, receiving at the input terminal thereof the detection signal DET and outputting a trigger output signal PSG by inverting the polarity of the detection signal DET; and a third PMOS transistor 236e having a source connected to the supply potential VDD, a drain connected between the output terminal of the first inverter and the input terminal of the second inverter, and a gate connected to the output terminal of the second inverter. By this feedback function of the third PMOS transistor 236e, the inversion between the detection signal DET and the trigger output signal PSG is delayed, providing the hysteresis characteristics for the trigger output signal PSG.

The high-level potential of the output signal AMPO from the DSG level detection circuit 235 does not reach the supply potential VDD in normal operation. Therefore, in order to reduce a through current flowing in the first inverter, the first PMOS transistor 236a is made smaller than the first NMOS transistor 236b.

The DSG precharge circuit 237 includes a first NAND circuit 237a, a second NAND circuit 237b, and a third NAND circuit 237c that receive the trigger output signal PSG at respective input terminals and externally input first, second, and third memory capacity designation signals MEM0, MEM1, and MEM2, respectively, at the other input terminals. The DSG precharge circuit 237 further includes a first PMOS transistor 237d, a second PMOS transistor 237e, and a third PMOS transistor 237g having respective sources receiving the supply potential VDD, respective drains outputting the DSG potential, and gates receiving the outputs from the first, second, and third NAND circuits 237a, 237b, and 237c, respectively, so as to be selectively activated.

In this embodiment, the back-gate potential VBB of about −1.0 V is applied to the substrates of the first NMOS transistor 231a and the second NMOS transistor 231b of the DSG driver 231 for reducing a sub-threshold leak current, thereby suppressing lowering of the DSG potential due to the sub-threshold leak current.

The equal back-gate potential VBB is also applied to the substrate of the first NMOS transistor 234a of the reference potential generation circuit 234 so that the reference potential VREF be substantially equal to the DSG potential.

The operations of the DSG level detection circuit 235, the Schmitt trigger 236, and the DSG precharge circuit 237 will be described with reference to the characteristic curves shown in FIG. 5.

The DSG level detection circuit 235 is a comparator that detects the difference between the DSG potential and the reference potential VREF and compares these potentials. The output signal AMPO is made HIGH when the DSG potential is lower than the reference potential VREF, and it is made LOW when the former is higher than the latter. When the DSG potential lingers at a potential close to the reference potential VREF, the output signal AMPO is set to an intermediate potential between the supply potential VDD and the ground potential VSS.

The Schmitt trigger 236, which provides the hysteresis characteristics by the feedback function of the third PMOS transistor 236e, receives the output signal AMPO from the DSG level detection circuit 235 and outputs the trigger output signal PSG having different thresholds for the rising and falling edges of the output signal AMPO.

The DSG precharge circuit 237 receives the trigger output signal PSG and activates at least one of the first, second, and third PMOS transistors 237d to 237f as current sources in response to the trigger output signal PSG to compensate (precharge) the DSG potential.

Figure 5:
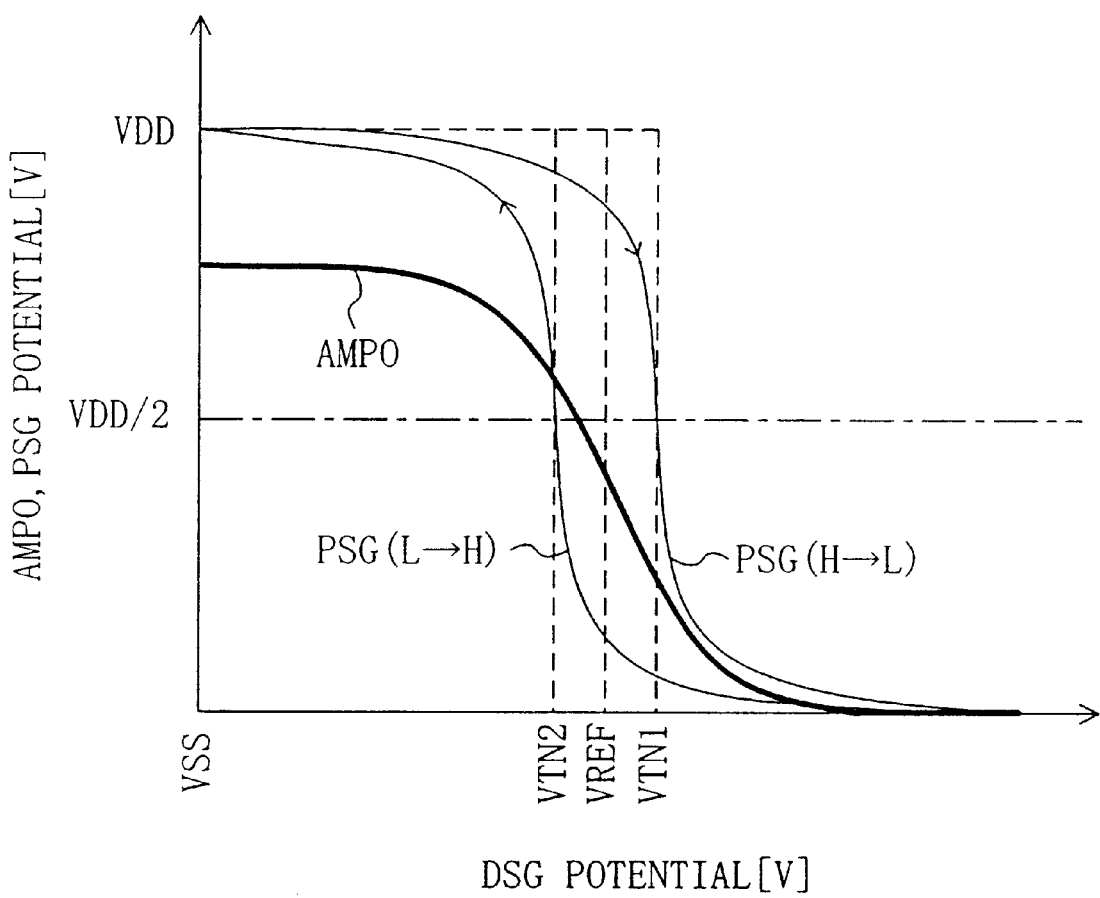
FIG. 5 is a conceptual view of the operation characteristics of a DSG potential compensation circuit of the semiconductor memory device of EMBODIMENT 1.

Referring to FIG. 5, in the case where the DSG potential is substantially equal to the ground potential VSS, both the output signal AMPO from the DSG level detection circuit 235 and the trigger output signal PSG from the Schmitt trigger 236 are made HIGH. This raises the DSG potential. When the DSG potential rises up to a first threshold potential VTN1 that is substantially equal to the threshold potential of the first NMOS transistor 231a of the DSG driver 231, the DSG precharge circuit 237 stops precharging.

In reverse, in the case where the DSG potential falls from a value higher than the first threshold potential VTN1, the DSG precharge circuit 237 starts precharging at the time at which the DSG potential falls down to a second threshold potential VTN2 that is lower than the first threshold potential VTN1, thereby raising the DSG potential up to the first threshold potential VTN1.

The operation of the semiconductor memory device of this embodiment with the above construction will be described with reference to the relevant drawings.

Figure 6:
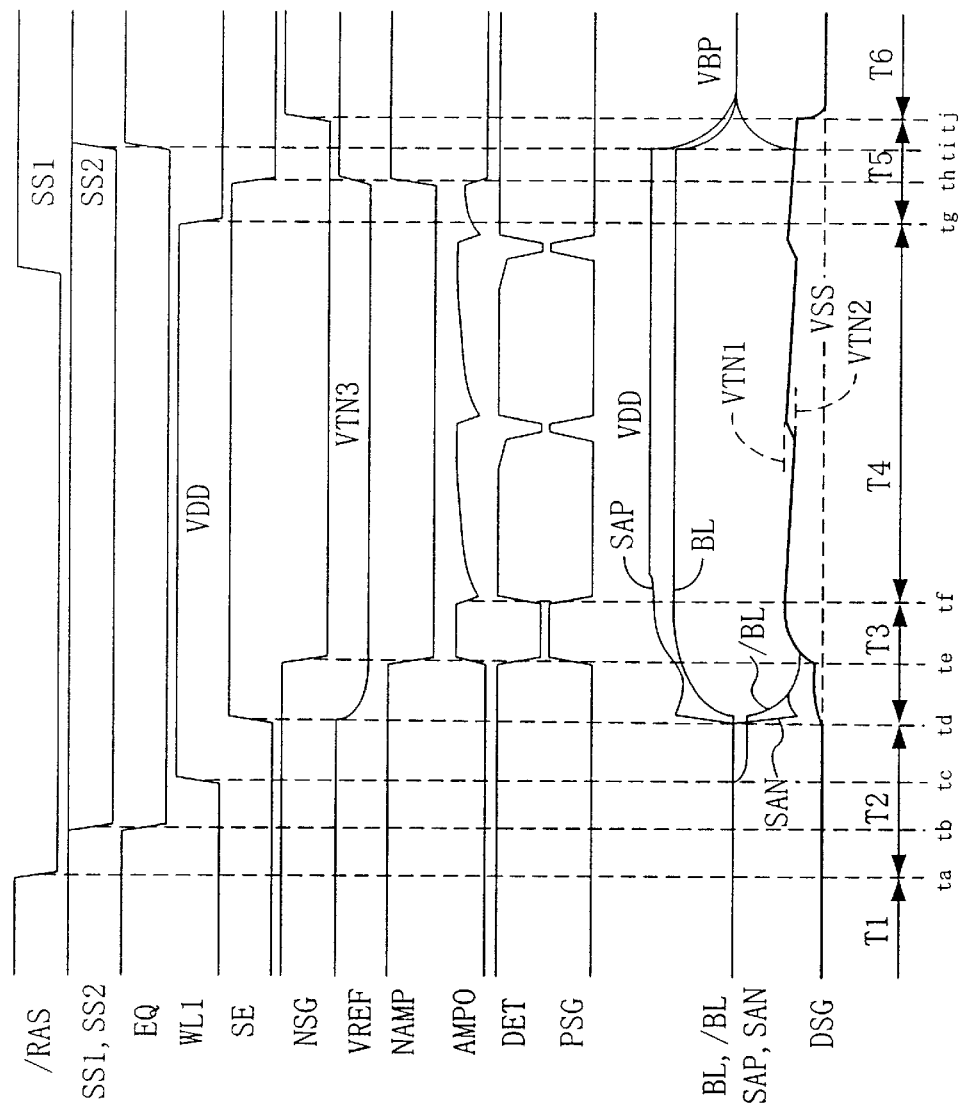
FIG. 6 is a timing chart of the semiconductor memory device of EMBODIMENT 1.

FIG. 6 is a timing chart of the DRAM as the semiconductor memory device of this embodiment. Herein described are the operations of the sense amplifier 201 and the sense amplifier ground circuit 23 performed when data in a memory cell A, one of the memory cells 51 shown in FIG. 3, in which low-level data has been written is read. The DRAM of this embodiment uses an internal strobe signal /RAS synchronized with an external row address strobe (RAS) signal as the start signal for the row decoder 40 and the sense amplifier control block 42.

Referring to FIG. 6, the first period T1, during which the internal strobe signal /RAS is HIGH, corresponds to the precharge period of the DRAM. During this precharge period, both the first and second shared gate signals SS1 and SS2 are HIGH. This activates the first and second transfer transistors 207 and 208, allowing the bit line pairs BL, /BL extending externally from the both sides of the sense amplifier 201 to be electrically connected with each other.

The equalizing signal EQ is also HIGH during the precharge period, activating the precharge NMOS transistors 203 and the equalizing NMOS transistor 204 of the sense amplifier 201 and thus allowing the bit line pairs BL, /BL to be precharged to the precharge potential VBP. In the sense amplifier driver 21, the precharge NMOS transistors 214 and the equalizing NMOS transistor 215 are similarly in the activated state. Since the SA drive signal SE is in the low-level inactivated state, both the NMOS switch transistor 211 and the PMOS switch transistor 213 are in the inactivated state, allowing both the SA supply potential SAP and the SA ground potential SAN to be precharged to the precharge potential VBP.

In the sense amplifier ground circuit 23 shown in FIG. 4, since the SA drive signal SE is LOW, the ground potential control signal NSG from the control signal generation circuit 232 is HIGH, resulting in the DSG potential being short-circuited with the ground potential as the first potential via the activated second NMOS transistor 231b.

In the reference potential generation circuit 234, the second NMOS transistor 234c is in the inactivated state due to the low-level SA drive signal SE. The reference potential VREF is therefore substantially equal to the power potential VDD.

Since the detection circuit control signal NAMP from the control signal generation circuit 232 is HIGH, the differential amplifier of the DSG level detection circuit 235 is in the inactivated state. The output signal AMPO is then fixed to LOW by the activated third NMOS transistor 235f. The low-level output signal AMPO makes the trigger output signal PSG LOW, thus inactivating all of the first, second, and third PMOS transistors 237d to 237f of the DSG precharge circuit 237.

As described above, during the first period T1 as the precharge period, in the sense amplifier ground circuit 23, the DSG potential is substantially equal to the ground potential, and no steady current flows in any of the control signal generation circuit 232, the reference potential generation circuit 234, the DSG level detection circuit 235, the Schmitt trigger 236, and the DSG precharge circuit 237. No current consumption is therefore observed during this period.

During the second period T2, as shown in FIG. 6, the internal strobe signal /RAS shifts from HIGH to LOW at time ta. At time tb after the lapse of a predetermined time, the second shared gate signal SS2, for example, shifts from HIGH to LOW, causing the second transfer transistors 208 shown in FIG. 3 to be inactivated. In this way, the first or second shared gate signal SS1, SS2 controls to open the connection of the sense amplifier 201 with either one of the bit line pairs BL, /BL extending from both sides of the sense amplifier 201 at timings other than that during the precharge period.

At time tb, also, the equalizing signal EQ shifts from HIGH to LOW. This stops the precharge between the bit line pair BL, \BL, and the precharge between the SA supply potential SAP and the SA ground potential SAN.

At time tc after the lapse of a predetermined time from time tb, the word line WL1 is selected among the plurality of word lines WLn shown in FIG. 3 by the row decoder 40 shown in FIG. 2, shifting the potential of the word line WL1 from LOW to HIGH. This activates the memory cell transistor 51a of the memory cell A, allowing for redistribution of accumulated charges between the bit complementary line /BL and the memory cell capacitor 51b.

In this embodiment where it is assumed that the memory cell A retains low-level data, the bit complementary line /BL is stabilized at a potential slightly lower than the precharge potential VBP after the word line WL1 is selected. Since the word line driver 41 shown in FIG. 2 does not boost the word lines WLn, the high level of the word line WL1 is substantially equal to the supply potential VDD. At time tc, the SA drive signal SE is still LOW, and thus, the DSG potential is kept short-circuited with the ground potential.

During the third period T3, at time td after the lapse of a predetermined time from time to, the SA drive signal SE shifts from LOW to HIGH. This activates both the NMOS switch transistor 211 and the PMOS switch transistor 213 of the sense amplifier driver 21 shown in FIG. 3. As a result, the supply potential VDD is supplied to the SAP line, one of the two drive lines in the sense amplifier driver 21, via the PMOS switch transistor 213, and the DSG potential is supplied to the SAN line, the other drive line, via the NMOS switch transistor 211. This activates the sense amplifier 201 mainly composed of the two pairs of PMOS transistors 202p and NMOS transistors 202n, and thus amplifies a minute initial potential difference generated between the bit line pair BL, /BL.

In the reference potential generation circuit 234 shown in FIG. 4, the second NMOS transistor 234c is activated by the activation of the SA drive signal SE. This lowers the reference potential VREF, which has been fixed to the high level by the PMOS transistor 234a having a lower current drive ability than the second NMOS transistor 234c, to the level of a threshold potential (VTN3) of the second NMOS transistor 234c. At this time, as shown in FIG. 6, the DSG potential exhibits a slight voltage rise from the ground potential VSS because a large current flows instantaneously to the DSG node due to simultaneous activation of a plurality of sense amplifiers 201.

At time te after the lapse of a delay time of about 1 ns from time td, of which delay time is generated by the delay circuit 232a of the control signal generation circuit 232 shown in FIG. 4, the internal control signal NSG shifts from HIGH to LOW, inactivating the second NMOS transistor 231b of the DSG driver 231. At this time, the detection circuit control signal NAMP output from the NAND circuit 232b also shifts from HIGH to LOW. This inactivates the third NMOS transistor 235f of the DSG level detection circuit 235, while activating the first PMOS transistor 235a and thus the DSG level detection circuit 235.

During the period from time te to time tf in the third period T3, the activated DSG level detection circuit 235 compares the DSG potential with the reference potential VREF. Since the DSG potential is lower than the reference potential VREF at a time immediately after time te, the output signal AMPO from the DSP level detection circuit 235 turns HIGH and thus the trigger output signal PSG also turns HIGH via the Schmitt trigger 236. As a result, the DSG precharge circuit 237 starts supplying a precharge current to the DSG node. With the supply of this precharge current, together with the current flow from the sense amplifiers 201, the DSG potential swiftly rises. At this time, at least one of the first, second, and third memory capacity designation signals MEM0 to MEM2 is in the activated state.

During the fourth period T4, at time tf, when the DSG potential exceeds the first threshold potential VTN1, the trigger output signal PSG turns LOW, stopping the current supply from the DSG precharge circuit 237. By this time, the potential at the bit complementary line /BL has fallen to a level substantially equal to the DSG potential, reducing the current amount flowing to the DSG node from the sense amplifiers 201. Accordingly, the rise of the DSG potential stops at a level near the first threshold potential VTN1.

The first threshold potential VTN1 is set in the Schmitt trigger 236 to be substantially equal to the threshold of the first NMOS transistor 231a of the DSG driver 231. The DSG potential at and after time tf is therefore maintained at a value near the first threshold potential VTN1 by the clamping function of the first NMOS transistor 231a.

During the fourth period T4, also, the DSG potential that has once risen to the first threshold potential VTN1 is gradually lowered by a sub-threshold leak current in the first NMOS transistor 231a. When the DSG potential becomes lower than the second threshold potential VTN2, the DSG level detection circuit 235 detects the lowered DSG potential and operates to raise the DSG potential again to the first threshold potential VTN1 by activating the DSG precharge circuit 237. This raising of the DSG potential is repeated intermittently over the fourth period T4, so that the DSG potential is kept between the first threshold potential VTN1 and the first threshold potential VTN2.

By the completion of the amplification of the potential difference between the bit line pair BL, /BL by the sense amplifier 201, the potential at the bit complementary line /BL as the low-potential one out of the bit line pair is now equal to the SA ground potential SAN, namely, the DSG potential kept between the first threshold potential VTN1 and the second threshold potential VTN2. The potential at the bit line BL as the high-potential line out of the bit line pair is now equal to a potential lowered from the supply potential VDD supplied from the SAP line by the threshold potential of the first transfer transistor 207.

The operation during the fifth period T5 is as follows. Immediately before the end of the fourth period T4, the internal strobe signal /RAS shifts from LOW to HIGH. At time tg, the word line WL1 shifts from HIGH to LOW, inactivating the memory cell transistor 51a. This terminates the electrical connection between the bit complementary line \BL and the memory capacitor 51b via the memory cell transistor 51a, allowing the potential at the bit complementary line \BL at time tg to be retained as the memory potential at the memory cell A.

In this embodiment where the bit complementary line /BL represents the low-potential one of the bit line pair BL, /BL, the memory potential at the memory cell A is substantially equal to the DSG potential at time tg and thus to a potential between the first threshold potential VTN1 and the second threshold potential VTN2.

At time th after the lapse of a predetermined time from time tg, the SA drive signal SE shifts from HIGH to LOW. This inactivates the second NMOS transistor 234c of the reference potential generation circuit 234, and thus raises the reference potential VREF to the supply potential VDD with a current flowing via the PMOS transistor 234a.

Simultaneously, the detection circuit control signal NAMP shifts from LOW to HIGH, inactivating the DSG level detection circuit 235.

At time ti after the lapse of a predetermined time from time th, the second shared gate signal SS2 shifts from LOW to HIGH, activating the second transfer transistors 208 shown in FIG. 3. At this time, the equalizing signal EQ also shifts from LOW to HIGH. Thus, the bit line pair BL, /BL, as well as the SAN and SAP lines, are precharged to the precharge potential VBP.

During the sixth period T6, at time tj after the lapse of about 1 ns from time th, the ground potential control signal NSG shown in FIG. 4 shifts from HIGH to LOW, activating the second NMOS transistor 231b of the DSG driver 231. This lowers the DSG potential to the ground potential VSS, resulting in the charges accumulated so far in the DSG potential line being drawn to the ground potential side. The subsequent circuit operation during the sixth period T6 is substantially the same as that during the first period T1 described above.

Hereinafter, the effect of the DSG potential that dynamically changes in conformity with the operation state of the semiconductor memory device of this embodiment will be described.

Figure 7A:
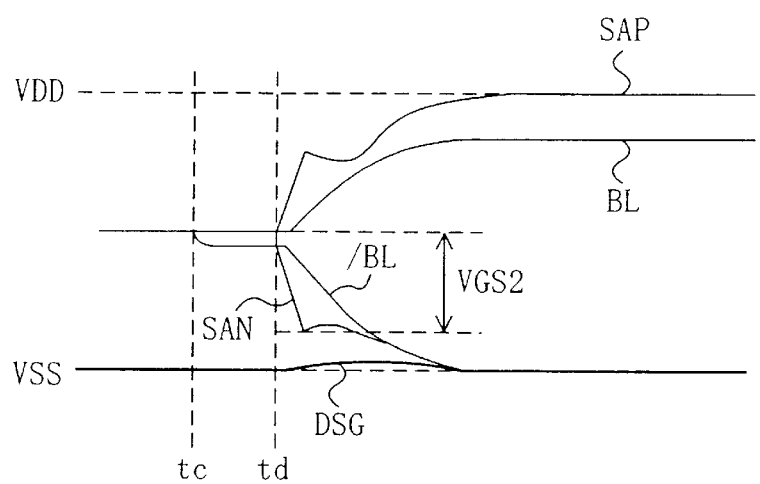
FIGS. 7(a) and 7(b) show potential waveforms representing changes in dynamic sense amplifier ground (DSG) potential when the DSG potential is fixed to the ground potential (as reference) and when the sense amplifier ground circuit of EMBODIMENT 1 is used, respectively.
Figure 7B:
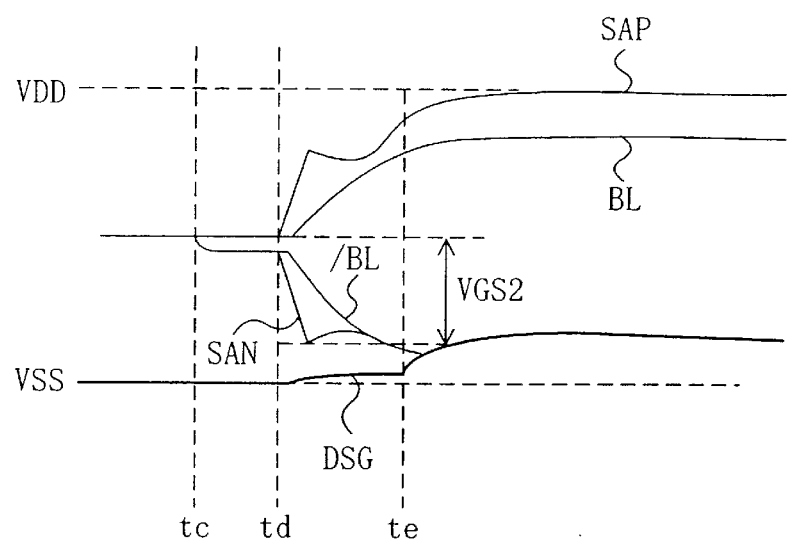

FIGS. 7(a) and 7(b) are graphs showing the change in the DSG potential in this embodiment, where (a) represents the case of the DSG potential being fixed to the ground potential for comparison and (b) represents the case of using the sense amplifier ground circuit in this embodiment. FIGS. 7(a) and 7(b) specifically show the waveforms of the bit line pair BL, /BL, the SA ground potential SAN, and the SA supply potential SAP during the driving of the sense amplifier. Times tc, td, and te shown in these figures are identical to those used in FIG. 6.

Referring to FIG. 7(b), the period from time td, at which the sense amplifier 201 is started to be driven, to time te, at which the DSG level detection circuit 235 of the sense amplifier ground circuit 23 is activated, is as short as about 1 ns. Therefore, the potential at the low-potential one out of the bit line pair BL, /BL is prevented from falling largely below the threshold potential VTN of the NMOS transistor. This ensures the first bias voltage VGS1 at the memory cell transistor 502 of the memory cell 500 shown in FIG. 16, for example, to be kept at or above near the threshold potential VTN at any time.

As described above, the first bias voltage VGS1 shown in FIG. 16 represents a gate to drain bias voltage at the memory cell transistor 502 in the inactivated state when the word line WL is LOW. The sub-threshold leak current flowing toward the channel is smaller exponentially as the value of the first bias voltage VSG1 is larger. The sub-threshold leak current flows in such a direction that data retained in the memory cell capacitor 501 may be destructed. By using the sense amplifier ground circuit 23 in this embodiment that can secure a large value of first bias voltage VGS1, such a sub-threshold leak current can be reduced. As a result, the charge retention property of the DRAM is improved.

Also as described above, the second bias voltage VGS2 shown in FIG. 16 represents a source to gate bias voltage at the first n-type transistor 511n of the sense amplifier 510. In the general cross-coupled sense amplifier 510, as the value of the second bias voltage VGS2 is smaller at the start of operation of the sense amplifier 510, the operation speed thereof is lower.

As an operational condition of the sense amplifier 510, the value of the second bias voltage VGS2 must be larger than the threshold value of the first n-type transistor 511n. The value of the second bias voltage VGS2 however becomes smaller as the supply voltage value is smaller, and as the value of the second bias voltage VGS2 during normal operation is smaller, low-voltage operation of the DRAM is more difficult.

In this embodiment, however, by using the sense amplifier ground circuit 23, the DSG potential, the potential at the bit complementary line /BL, and the SA ground potential SAN change in the same manner as those shown in FIG. 7(a) where the DSG potential is fixed to the ground potential during the period from time td immediately after the activation of the sense amplifier 201 to time te. Therefore, the second bias voltages VGS2 in the two cases observed immediately after the start of operation of the sense amplifier 201 are equal to each other.

Thus, by using the sense amplifier ground circuit 23 in this embodiment, the operation speed of the sense amplifier 201 is not lowered. Further, with the sufficiently large value of the second bias voltage VGS2, it is ensured that the operating lower limit voltage can be lowered.

In the sense amplifier ground circuit 23, the DSG potential is short-circuited with the ground potential VSS when the sense amplifier 201 is in the inactivated state, so that all the circuits including the control signal generation circuit 23, the reference potential generation circuit 234, the DSG level detection circuit 235, the Schmitt trigger 236, and the DSG precharge circuit 237 are made inactivated. There is therefore no steady current consumption. Thus, the sense amplifier ground circuit 23 in this embodiment can widely reduce the power consumption related to the generation of the DSG potential in the standby state of the DRAM.

As shown in FIG. 7(b), the rising of the DSG potential is started by activating the DSG precharge circuit 237 at time te. At time te, however, the potential at the bit complementary line /BL has not yet fallen to the level of the DSG potential, allowing a current to flow to the DSG node from the sense amplifier 201. In this way, the second NMOS transistor 231b of the DSG driver 231 is inactivated when a current is still flowing to the DSG node from the sense amplifier 201. This results in that subsequent charges flowing from the sense amplifier 201 are accumulated in the DSG potential line. Such accumulated charges contribute to the precharge of the DSG potential.

In actual DRAMs, since the amount of the current flowing from the sense amplifiers 201 is significantly large, a majority of charges contributing to the precharge of the DSG potential are supplied from the sense amplifiers 201. The current flowing from the sense amplifier 201 is caused by the release of charges accumulated in the bit line pair BL, /BL during the precharge period. A majority of the current required for raising the DSG potential at time te is therefore produced by such released charges. In this way, power consumption newly required for switching of the DSG potential can be minimized.

Thus, as described above, the semiconductor memory device of this embodiment is provided with the sense amplifier ground circuit 23 for generating and outputting the dynamic sense amplifier ground (DSG) potential that dynamically and positively changes the low-level potential to be applied to the memory cells 51, the bit line pairs BL, /BL, and the sense amplifiers 201, namely, the sense amplifier ground potential SAN. The sense amplifier ground circuit 23 keeps the DSG potential at around the ground potential VSS during a predetermined period immediately after the activation of the sense amplifier 201 (for about 1 ns from time td to time te). After the lapse of the predetermined period, the sense amplifier ground circuit 23 raises the potential at the low-potential one of the bit line pair BL, /BL while receiving released charges from the sense amplifier 201. This makes it possible to secure a sufficiently large value of the second bias voltage VGS2 required immediately after the activation of the sense amplifier 201 without sacrificing the sense speed and the operational lower limit voltage. This also makes it possible to secure a sufficiently large value of the first bias voltage VGS1 for the inactivated memory cells 51, preventing the charge retention property of the memory cells 51 from degrading.

During the precharge period of the bit line pair BL, /BL, the sense amplifier ground circuit 23 does not consume a current except that required for the grounding of the DSG potential. This reduces the power consumption of the entire DRAM compared with the conventional boosted sense amplifier ground method.

Hereinafter, the use and effect of the first, second, and third memory capacity designation signals MEM0, MEM1, and MEM2 externally input into the DSG precharge circuit 237 shown in FIG. 4 will be described.

In the DRAM of this embodiment, it is assumed that the physical memory capacity of the memory cell array block 10 is changeable. The first, second, and third memory capacity designation signals MEM0, MEM1, and MEM2 are used as control signals for changing the memory capacity.

Figure 8:
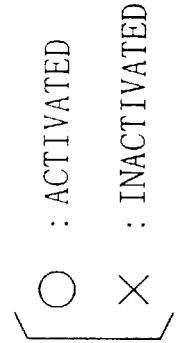
FIG. 8 is a table of combinations of MEM signals supplied to a DSG precharge circuit of EMBODIMENT 1.

FIG. 8 shows exemplified setting of the MEM signals to be input into the DSG precharge circuit 237 in this embodiment, representing seven combinations of the three MEM signals. For example, if only the first memory capacity designation signal MEM0 is HIGH, the memory capacity is designated as 1 Mbit or 2 Mbits. If only the second memory capacity designation signal MEM1 is HIGH, the memory capacity is designated as 3 Mbits. The pMOS Tr.237d, PMOS Tr.237e, and pMOS Tr.237f correspond to the first, second, and third PMOS transistors 237d, 237e, and 237f shown in FIG. 4 having gate widths of 20 μm, 40 μm, and 80 μm, respectively. The third PMOS transistor 237f is thus designed to have the largest current supply ability. The transistor activated when the trigger output signal PSG is HIGH is represented by mark ○ and the transistor that is not activated is represented by mark X.

Receiving such plurality of memory capacity designation signals MEM0 to MEM2, the sense amplifier ground circuit 23 can change the current supply ability of the DSG precharge circuit 237 depending on the memory capacity of the DRAM. The precharge ability of the DSG potential can therefore be optimized even when the capacity of the DSG potential line changes depending on the memory capacity, thereby suppressing an increase in power consumption.

An alternative example of the use of the memory capacity designation signals MEM will be described.

It is also possible and effective to switch the current supply ability of the DSG precharge circuit 237 depending on the number of sense amplifiers 201 selectively activated in response to an externally input column address.

In a DRAM capable of changing the number of sense amplifiers 201 activated at one timing during normal read or refresh operation, the rising of the DSG potential immediately after time te shown in FIG. 7(b) is more delayed as the number of sense amplifiers 201 activated simultaneously is smaller. This relatively prolongs the duration in which the potential at the low-potential one out of the bit line pair is below the first threshold potential VTN1 during the period from time td to time te, and thus may disadvantageously weaken the effect of improving the pause time In this alternative example, the current supply ability of the DSG precharge circuit 237 can be selected depending on the number of the sense amplifiers 201 activated simultaneously by an appropriate combination of the first, second, and third memory capacity designation signals MEM0 to MEM2, so that the speed of rising of the DSG potential can be kept at a predetermined value. Thus, the potential retention property can be improved in a more reliable manner.

In this embodiment, the cross-coupled sense amplifier 201 as shown in FIG. 3 was used. Alternatively, any circuit that can determine the potentials at a memory cell and a bit line and amplify the minute potential difference read onto the bit line may be used. For example, a current-mirror type or a current detection type may be used.

The connecting positions of the NMOS transistors 203 for precharging the bit line pair BL, /BL and the NMOS transistor 204 for equalizing the bit line pair, as well as the connections between the first data line 60 and the bit line BL and between the second data line 61 and the bit complementary line /BL, are not limited to those described in this embodiment. Lacing with other signals may precede or follow these connections as long as the resultant operation does not largely depart from the principle.

The configurations and operations of the reference potential generation circuit 234 and the Schmitt trigger 236 of the sense amplifier ground circuit 23 described with reference to FIG. 4 were discussed merely in the block level. The configurations of these circuits in the transistor level are not limited to those described above.

The back-gate potential VBB was set at about −1.0 V in this embodiment. The essence of the present invention will not be impaired if the back-gate potential VBB is set at a value other than the above, for example, at the ground potential.

EMBODIMENT 2

Figure 9:
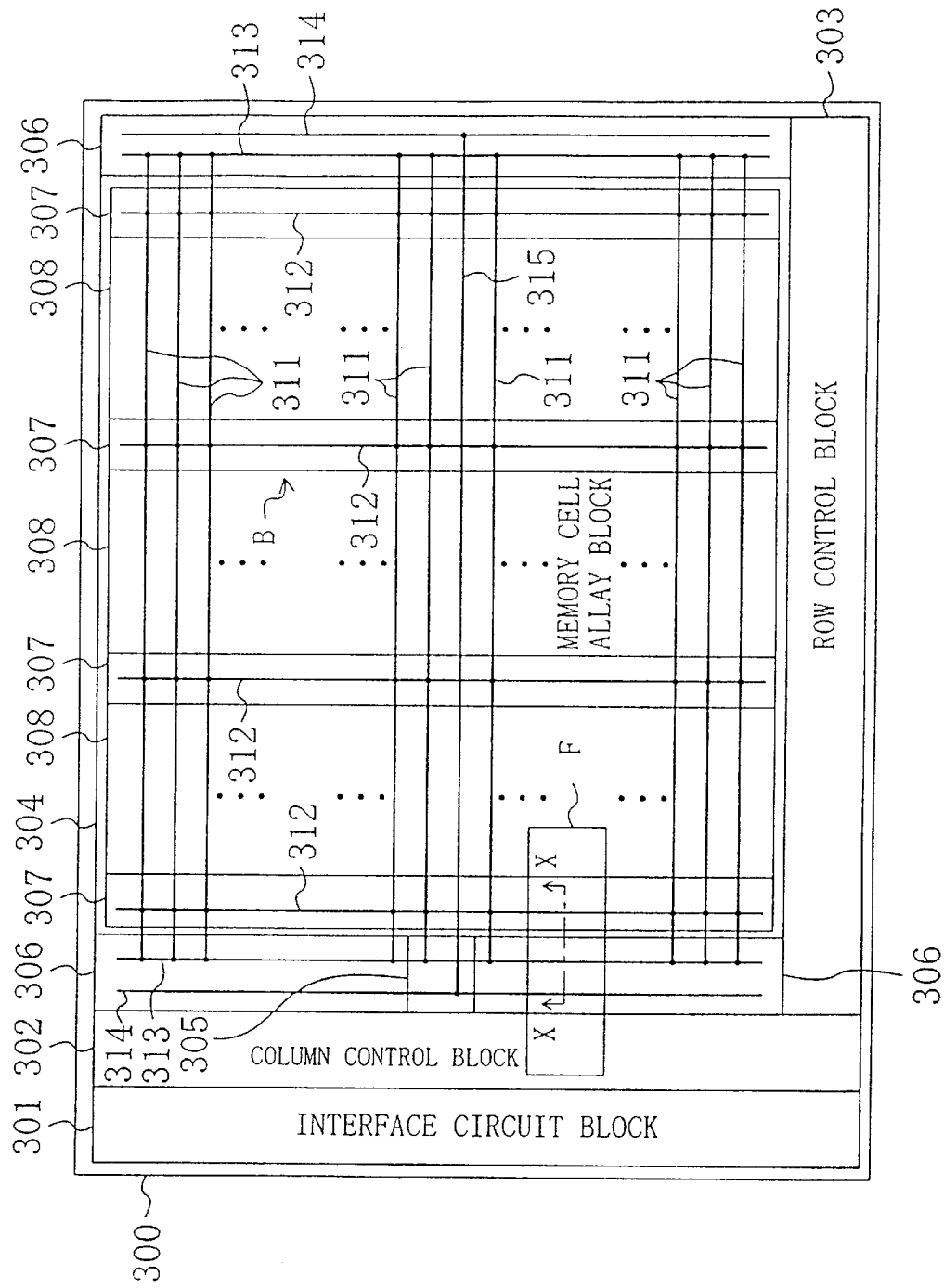
FIG. 9 is a block diagram of a semiconductor memory device of EMBODIMENT 2 according to the present invention.

FIG. 9 shows a layout of a DRAM chip as the semiconductor memory device of EMBODIMENT 2 according to the present invention. Referring to FIG. 9, a DRAM chip 300 includes on the principal plane thereof: an interface circuit block 301 including circuits for controlling external data input/output; a column control block 302 including circuits for controlling columns of matrix-shaped memory cells; a row control block 303 including circuits for controlling rows of such memory cells; memory core blocks 304 each including a plurality of memory cell array blocks and the like; a sense amplifier ground circuit 305 for generating a dynamic sense amplifier ground (DSG) potential that is a low-level potential for sense amplifiers and the like; and DSG drivers 306 for supplying the DSG potential to the sense amplifiers and the like.

The memory core blocks 304 are arranged with a space from one another in the direction of the length of the column control block 302. Each memory core block 304 includes: a plurality of sense amplifier blocks 307 each including a plurality of sense amplifiers and sense amplifier drivers; and a plurality of memory cell array blocks 308 each including a plurality of memory cells arranged in a matrix, placed between the sense amplifier blocks 307.

The DSG drivers 306, which correspond to the DSG diver circuit 231 in EMBODIMENT 1 shown in FIG. 4, extend between the memory core block 304 and the column control block 302 and on the side of the memory core block 304 opposite to the side on which the column control block 302 is placed.

The sense amplifier ground circuit 305 corresponds to the control signal generation circuit 232 and the DSG potential compensation circuit 233 in EMBODIMENT 1 shown in FIG. 4.

As shown in FIG. 9, the reference numeral 311 denotes first DSG potential lines made of a plurality of metal lines running in the row direction constituting a wiring layer of the DRAM chip 300, which are formed with a space therebetween, for example, with a comparatively narrow space substantially equal to or up to about three times the space between the sense amplifiers. The reference numeral 312 denotes second DSG potential lines made of metal lines running in the column direction constituting the wiring layer of the DRAM chip 300, which are electrically connected with the first DSG potential lines 311 at respective intersections. The reference numeral 313 denotes third DSG potential lines extending in the column direction above the sense amplifier ground circuit 305 and the DSG driver 306, which are electrically connected with the first DSG potential lines 311.

The reference numeral 314 denotes first NSG potential lines made of metal lines extending in the column direction above the sense amplifier ground circuit 305 and the DSG driver 306 for transmitting an internal control signal NSG between the sense amplifier ground circuit 305 and the DSG driver 306. The reference numeral 315 denotes second NSG potential lines made of metal lines extending in the row direction above the memory core block 304, which are electrically connected with the first NSG potential lines 314. The first and second NSG potential lines 314 and 315 are formed as second-layer metal lines of the DRAM chip 300, while the first, second, and third DSG potential lines 311 to 313 are formed as third-layer metal lines of the DRAM chip 300 as will be described layer.

As described above, in this embodiment, the DSG drivers 306 are formed on both sides of the memory core block 304.

The first, second, and third DSG potential lines 311 to 313 in this embodiment are still short-circuited with the ground potential VSS by the DSG driver 306 during time td at which the sense amplifiers are driven and time te after a predetermined time from time td, as in EMBODIMENT 1 shown in FIG. 6. During this period, however, a large current instantaneously flows from a number of sense amplifiers activated simultaneously, causing potential drop due to the resistance of the DSG potential lines 311 to 313. The DSG potential therefore exhibits a slight rise especially near the activated sense amplifiers. This potential rise is more eminent at positions of the DSG potential lines 311 to 313 that are relatively distant from the DSG driver 306 where the resistance component thereof is larger. As a result, when such potential rise is excessive, the second bias voltage VGS2 shown in FIG. 16 lowers immediately after the activation of the sense amplifiers. This causes degradation of the driving ability of the sense amplifiers.

In order to suppress the above potential rise, the resistance component of the DSG potential lines 311 to 313 should be minimized. For this purpose, in the DRAM chip 300 of this embodiment, the DSG potential lines 311 to 313 are arranged in a mesh shape for reducing the line resistance, and the DSG drivers 306 are provided on both sides of the memory core block 304.

By providing the DSG drivers 306 on both sides of the memory core block 304, the average distance between the DSG driver 306 and the sense amplifiers is halved compared with the case where the DSG driver 306 is placed on either one side. Also, since currents from the sense amplifiers flow to the two DSG drivers 306 on both sides, the resistance component of the DSG potential lines 311 to 313 can be suppressed effectively to a half or less.

Another advantage of the above layout is as follows. Assume that all sense amplifiers included in one of the plurality of sense amplifier blocks 307, for example, a sense amplifier block B, are activated simultaneously. Since the DSG driver 306 is arranged so that it is located at a position equally apart from all the sense amplifiers in the block B, the resistances of the DSG potential lines 311 and 313 between the sense amplifiers and the DSG driver 306 are substantially equal to one another. As a result, an occurrence of a variation in the operation characteristics of the sense amplifiers activated simultaneously is reduced, stabilizing read or write operation of the DRAM.

Figure 10:
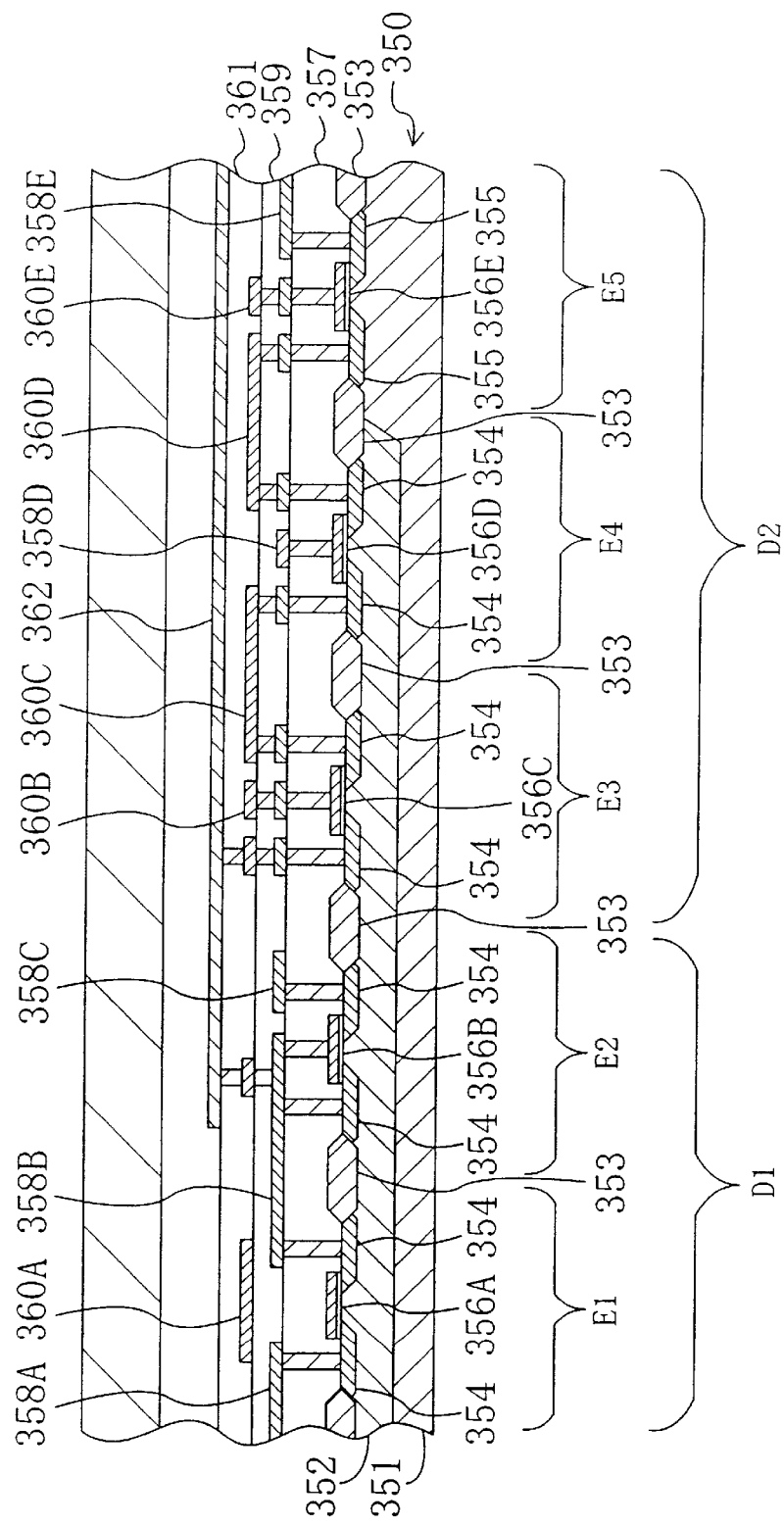
FIG. 10 is a cross-sectional view of the semiconductor memory device of EMBODIMENT 2 taken along line X—X in FIG. 9, showing a semiconductor substrate with elements and lines formed on the principal plane thereof after packaging.

FIG. 10 is a partial cross-sectional view of the DRAM chip of this embodiment taken along line X—X in FIG. 9, showing the semiconductor substrate with elements and lines formed on the principal plane thereof after packaging. In FIG. 10, an area D1 corresponds to the DSG driver 306 and an area D2 corresponds to the sense amplifier drivers in the sense amplifier block 307, where the sectional configuration of respective transistors are shown.

In the area D1, sub-areas E1 and E2 respectively correspond to the second NMOS transistor 231b and the first NMOS transistor 231a of the DSG driver 231 in EMBODIMENT 1 shown in FIG. 4. In the area D2, sub-areas E3, E4, and E5 respectively correspond to the NMOS switch transistor 211, the equalizing NMOS transistor 215, and the PMOS switch transistor 213 of the sense amplifier driver 21 in EMBODIMENT 1 shown in FIG. 3.

Referring to FIG. 10, an n-type well region 351 is formed in a semiconductor substrate 350 made of silicon, for example. A p-type well region 352 is selectively formed in the n-type well region 351.

Isolation regions 353 made of insulating films or the like are selectively formed on the principal plane of the semiconductor substrate 350. N-type diffusion regions 354 are formed with spaces therebetween in the sub-areas E1, E2, E3, and E4, while p-type diffusion regions 355 are formed with a space therebetween in the sub-area E5.

Insulating gate electrodes 356A, 356B, 356C, 356D, and 356E are formed on the principal plane of the semiconductor substrate 350 so as to straddle respective spaces between the diffusion regions 354, 355 in the sub-areas E1 to E5, respectively.

On a first interlayer insulating film 357 formed covering the resultant entire semiconductor substrate 350, first-layer metal lines 358A to 358E are formed so as to be in connection with respective contact holes formed through the first interlayer insulating film 357. The lines 358A and 358C serve as VSS potential lines for supplying the ground potential VSS, the line 358B serves as a DSG potential line for supplying the DSG potential, the line 358D serves as an EQ signal line for supplying an equalizing signal, and the line 358E serves as a VDD potential line for supplying the supply potential VDD.

On a second interlayer insulating film 359 formed covering the first-layer metal lines 358A to 358E, second-layer metal lines 360A to 360E are formed so as to be selectively connected with the first-layer metal lines 358A to 358E through vias formed through the second interlayer insulating film 359. The line 360A serves as an NSG signal line for supplying the internal control signal NSG inside the DSG driver 306, the line 360B serves as an SE signal line for supplying an SA drive signal SE, the line 360C serves as an SAN potential line for supplying a sense amplifier (SA) ground potential SAN, the line 360D serves as an SAP potential line for supplying a sense amplifier (SA) supply potential SAP, and the line 360E serves as a /SE signal line for supplying a complementary signal /SE of the SA drive signal SE.

On a third interlayer insulating film 361 formed covering the second-layer metal lines 360A to 360E, a third-layer metal line 362 is formed so as to be selectively connected with the second-layer metal lines 360A to 360E through vias formed through the third interlayer insulating film 361, serving as the DSG potential line for supplying the DSG potential. The DSG potential line 362 corresponds to the first DSG potential line 311 shown in FIG. 9.

The NSG signal line 360A corresponds to the first NSG potential line 314 shown in FIG. 9, which is connected in parallel with the gate electrode 356A at a position not shown suppressing the effective line resistance of the gate electrode 356A.

The VDD potential as a substrate potential is applied to the n-type well region 351, and a back-gate potential VBB that is lower than the ground potential VSS is applied to the p-type well region 352.

In order to reduce power consumption in the standby state, a normal DRAM uses a p-type well with the back-gate potential VBB applied thereto for the entire area of the memory cell array blocks and areas of the sense amplifiers and the sense amplifier drivers where NMOS transistors are formed. Also, in the DRAM chip 300 in this embodiment, in order to suppress lowering of the DSG potential due to an OFF-leak current, the VBB potential is applied to the entire p-type well region of the DSG driver as described above.

Figure 11:
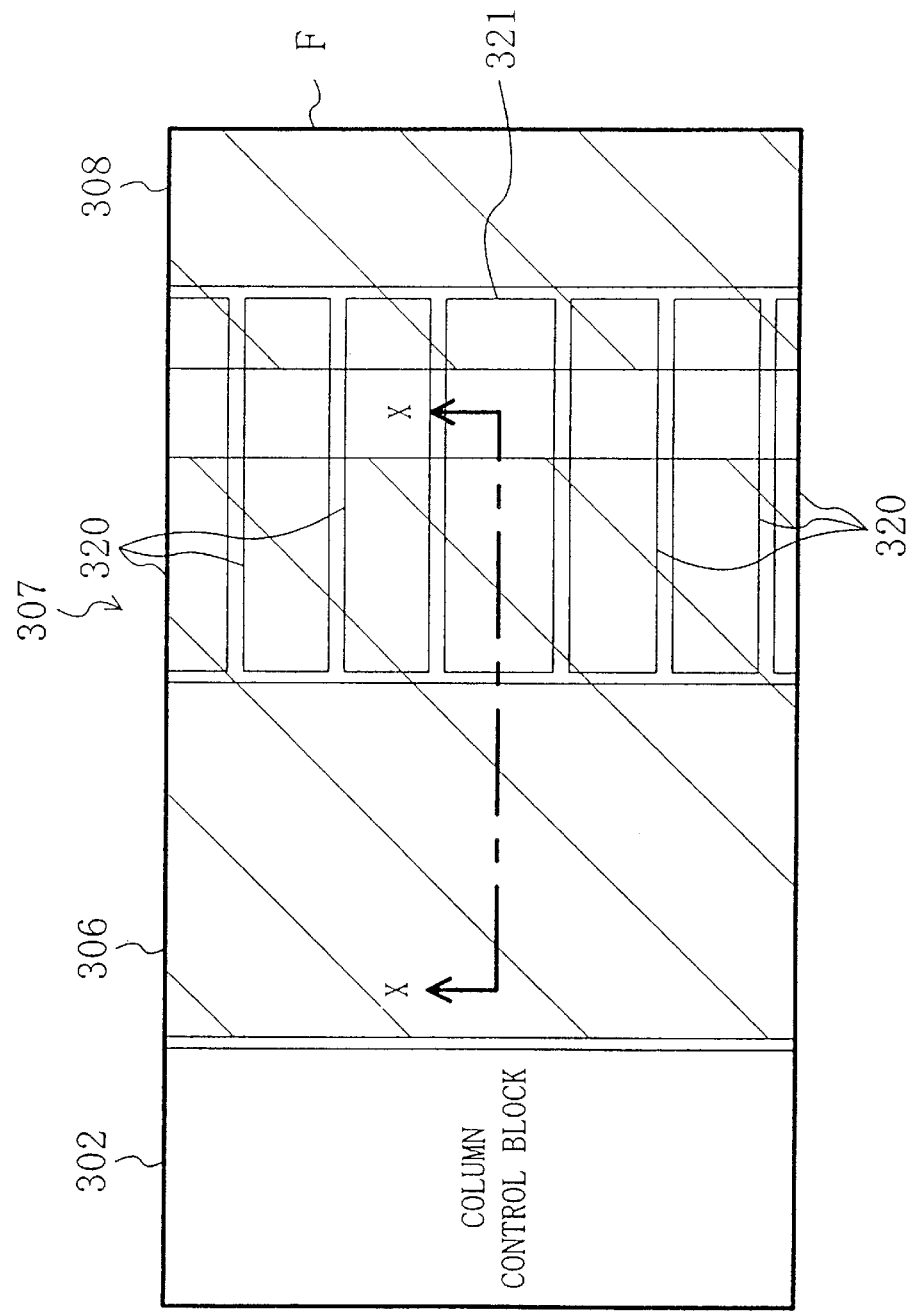
FIG. 11 is an enlarged plan view of an area F including the line X—X in FIG. 9.

FIG. 11 is an enlarged layout of an area F including the line X—X in FIG. 9. In FIG. 11, the reference numerals 320 and 321 denote the sense amplifiers and the sense amplifier driver constituting the sense amplifier block 307, respectively.

The hatched area including the DSG driver 306, the sense amplifier block 307, and the memory cell array block 308 represents the p-type well region to which the back-gate potential VBB is applied. As is seen from FIG. 11, therefore, in the sense amplifiers 320 and the sense amplifier driver 321 of the sense amplifier block 307, while the NMOS transistors are formed in the p-type well region receiving the back-gate potential VBB, the PMOS transistors are formed in the n-type well region.

Transistors formed in well regions of different conductivities need to be formed with a predetermined space therebetween to avoid a problem such as latch-up.

In this embodiment, as shown in FIG. 9, since the DSG drivers 306 are formed on both sides of the memory core block 304, the DSG drivers 306 are located adjacent to the sense amplifiers 320 and the sense amplifier drivers 321 in the sense amplifier block 307. However, since both blocks are formed in the p-type well region receiving the back-gate potential VBB in the adjacent regions thereof, they can share the same p-type well region. This eliminates the necessity of placing the transistors with a predetermined space therebetween, and thus contributes to improving the integration of the chip.

EMBODIMENT 3

Figure 12:
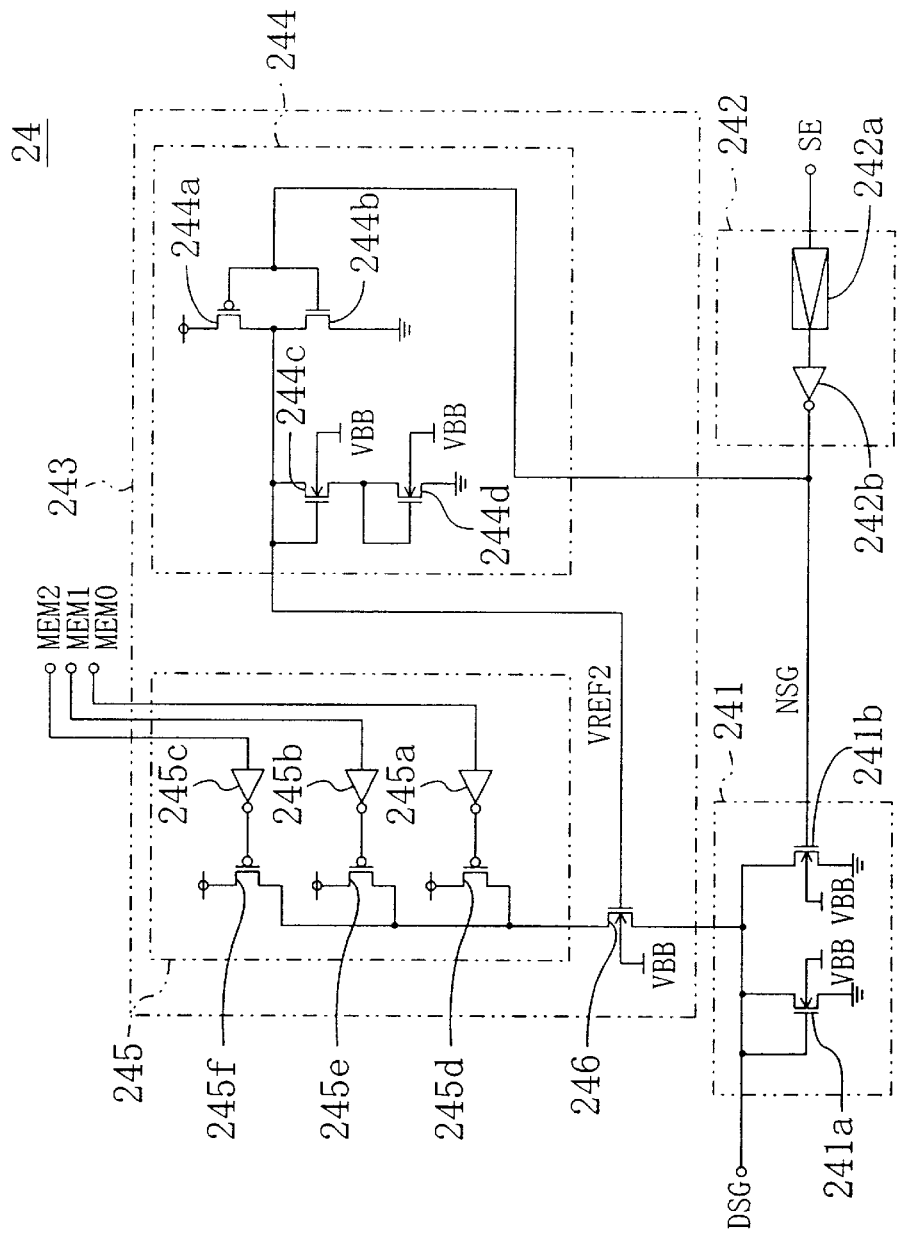
FIG. 12 is a circuit diagram of a sense amplifier ground circuit of a semiconductor memory device of EMBODIMENT 3 according to the present invention.

FIG. 12 shows a configuration of a sense amplifier ground circuit in the semiconductor memory device of EMBODIMENT 3 according to the present invention. Referring to FIG. 12, a sense amplifier ground circuit 24 includes: a DSG driver 241 as the ground potential generation part and the threshold potential generation part for driving the dynamic sense amplifier ground (DSG) potential; a control signal generation circuit 242 as the ground potential control part; and a DSG potential compensation circuit 243 as the potential compensation part.

The DSG potential compensation circuit 243 includes: a reference potential generation circuit 244 as the reference potential generation part for generating a reference potential VREF2; a DSG precharge circuit 245 as the current supply ability switching means for supplying a current for boosting the DSG potential to the DSG driver 241; and a DSG level detection transistor 246 composed of an NMOS transistor for detecting the DSG potential, having a gate connected to the reference potential VREF2 (a VREF2 node), a drain connected to the DSG precharge circuit 245, and a source connected to the DSG driver 241.

The DSG driver 241 includes: a first NMOS transistor 241a as the threshold potential generation semiconductor element having a gate and a drain commonly connected to a DSG node having the DSG potential; and a second NMOS transistor 241b as the ground potential generation semiconductor element connected in parallel with the first NMOS transistor 241a for setting the DSG potential to the ground potential in response to a ground potential control signal NSG from the control signal generation circuit 242.

The control signal generation circuit 242 includes: a delay circuit 242a receiving a sense amplifier (SA) drive signal SE to output a delay signal having a predetermined delay time, for example, about 1 ns, added to the SA drive signal SE; and an inverter 242b receiving the delay signal from the delay circuit 242a to output the ground potential control signal NSG by inverting the received signal.

The reference potential generation circuit 244 includes: a PMOS transistor 244a and a first NMOS transistor 244b constituting an inverter of which input terminal receives the internal control signal NSG from the control signal generation circuit 242; a second NMOS transistor 244c having a gate and a drain commonly connected to the external terminal of the inverter and the gate of the DSG level detection transistor 246; and a third NMOS transistor 244d having a gate and a drain commonly connected to the source of the second NMOS transistor 244c and a grounded source. The size of the PMOS transistor 244a is smaller than that of the second and third NMOS transistors 244a and 244d.

The DSG precharge circuit 245 includes a first inverter 245a, a second inverter 245b, and a third inverter 245a that receive external first, second, and third memory capacity designation signals MEM0, MEM1, and MEM2, respectively, at the respective input terminals. The DSG precharge circuit 245 further includes a first PMOS transistor 245d, a second PMOS transistor 245e, and a third PMOS transistor 245f which have respective sources receiving the supply potential VDD, respective drains outputting the DSG potential, and gates receiving the outputs from the first, second, and third inverters 245a, 245b, and 245c, respectively, so as to be selectively activated in a manner conforming to the core configuration and operation specification of the DRAM as in EMBODIMENT 1.

The back-gate potential VBB of about −1.0 V is applied the substrates of the first and second NMOS transistors 241a and 241b of the DSG driver 241 in this embodiment. Therefore, lowering of the DSG potential due to a sub-threshold leak current is suppressed. Similarly, the back-gate potential VBB of the same value is applied to the substrates of the second and third NMOS transistors 244c and 244d of the reference potential generation circuit 244 and the DSG level detection transistor 246. Such transistors receiving the back-gate potential at the substrates thereof have the same threshold voltage VTN.

The operation of the sense amplifier ground circuit 24 with the above configuration will be described.

Figure 13:
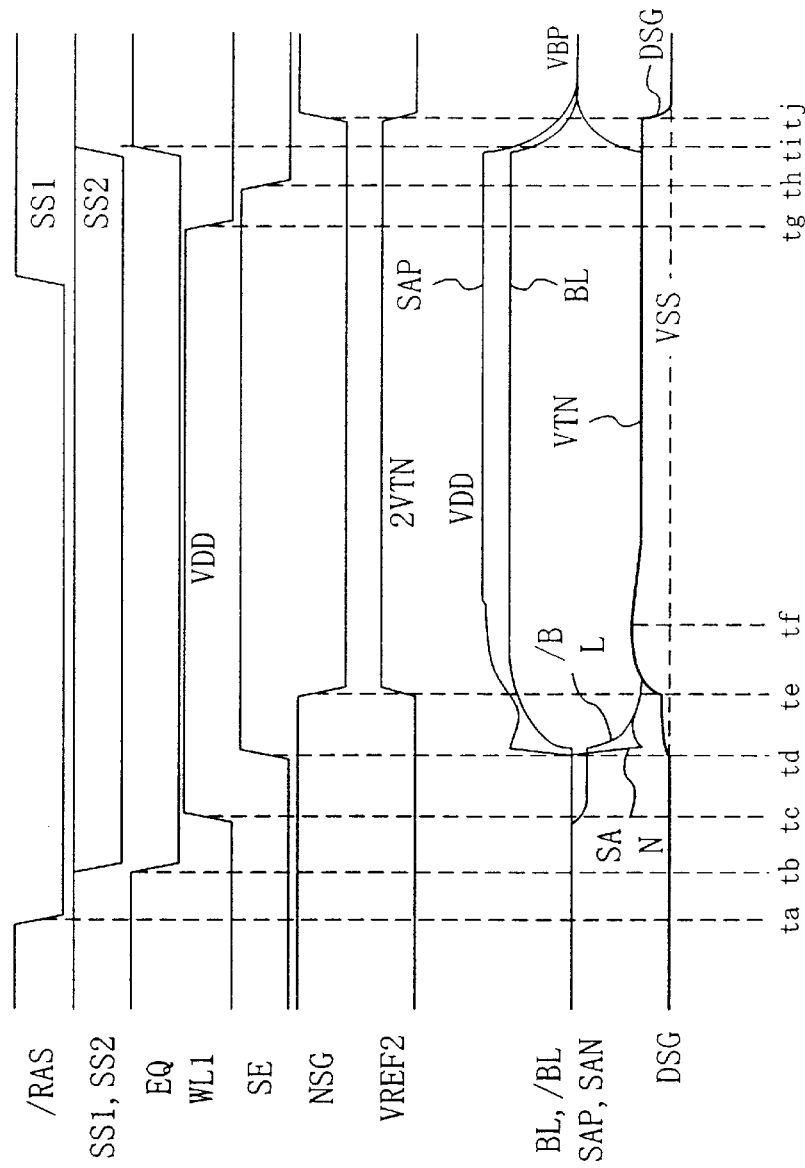
FIG. 13 is a timing chart of the sense amplifier ground circuit of the semiconductor memory device of EMBODIMENT 3.

FIG. 13 is a timing chart of the sense amplifier ground circuit 24 in this embodiment. In this embodiment, other configuration of the DRAM other than that of the sense amplifier 24 is substantially the same as that described in EMBODIMENT 1 with reference to FIG. 2. Note that the internal strobe signal /RAS, the first and second shared gate signals SS1 and SS2, the equalizing signal EQ, and the word line signal WL1, the SA drive signal SE have the same timings as those of corresponding ones shown in FIG. 6, and times ta to tj are at the same timings on the same time axis as those of corresponding ones in FIG. 6.

Hereinafter, only the difference from EMBODIMENT 1 will be described. During the period from the precharge period to time td, the SA drive signal SE is LOW and thus the ground potential control signal NSG output from the control signal generation circuit 242 is HIGH. Therefore, the PMOS transistor 244a of the reference potential generation circuit 244 is in the inactivated state, while the first NMOS transistor 244b is in the activated state, keeping the reference potential VREF2 at the ground potential.

In the DSG precharge circuit 245, at least one of the first, second, and third PMOS transistors 245d to 245f is in the activated state at any time by being selected by the first, second, and third memory capacity designation signals MEM0 to MEM2. However, in the above state where the VREF2 node is kept grounded inactivating the DSG level detection transistor 246, the DSG precharge circuit 245 does not supply a current to the DSG driver 241. Since the second NMOS transistor 241b of the DSG driver 241 receives the high-level ground potential control signal NSG, the DSG potential is kept at the ground potential VSS during this period.

At time td, the SA drive signal SE shifts from LOW to HIGH. At time te after the lapse of a predetermined time, for example, about 1 ns, generated by the delay circuit 242a of the control signal generation circuit 242, the ground potential control signal NSG shifts from HIGH to LOW. This inactivates the second NMOS transistor 241b of the DSG driver 241 that has short-circuited the DSG potential with the ground potential.

At the same time, in the reference potential generation circuit 244, the PMOS transistor 244a of the inverter is activated while the first NMOS transistor 244b thereof is inactivated. The reference potential VREF2 is stabilized at a potential determined by the ratio of the current drive ability of the PMOS transistor 244a to the second and third NMOS transistors 244c and 244d. Since the size of the PMOS transistor 244a is small compared with that of the second and third NMOS transistors 244c and 244d, the reference potential VREF2 is stabilized at a sum of the threshold values of the second and third NMOS transistors 244c and 244d, namely, 2VTN.

In the above state, the DSG level detection transistor 246 is activated because the reference potential VREF2 as the gate potential rises from the ground potential to 2VTN while the DSG potential as the source potential exhibits a slight rise by a current flowing from the sense amplifiers. This allows for start of current supply from the DSG precharge circuit 245 to the DSG note.

Thus, during the period from time te to time tf, the DSG potential swiftly rises by receiving the current flowing from the plurality of sense amplifiers activated simultaneously and the current supplied from the DSG precharge circuit 245.

At time tf, when the DSG potential rises to the threshold potential VTN, the source-gate bias voltage of the DSG level detection transistor 246 decreases to the level of the threshold voltage VTN thereof, so that the current supply from the DSG precharge circuit 245 to the DSG node is shut off again.

When the DSG potential rises beyond the threshold potential VTN, the first NMOS transistor 241a of the DSG driver 241 is activated. As a result, at and after time tf, the DSG potential is stabilized at near the threshold potential VTN due to two functions: First, excessively accumulated charges in the DSG potential line are drawn to the ground potential; and secondly, the amount of the current flowing from the sense amplifiers to the DSG node is reduced because the potential at the bit complementary line /BL lowers to substantially the same level as the DSG potential during the time from time tf to time tj.

Thus, during the period from time tf to time tj, the DSG potential is kept clamped to near the threshold potential VTN. In the case where the DSG potential lowers below the threshold potential VTN due to a sub-threshold leak current in the first and second NMOS transistors 241a and 241b of the DSG driver 241, external noise, and the like, the DSG level detection transistor 246 is activated to supply a current from the DSG precharge circuit 245 to the DSG note so as to raise the DSG potential to the threshold potential VTN.

At time th, the SA drive signal SE shifts from HIGH to LOW. At time tj after the lapse of a predetermined time generated by the delay circuit 242a of the control signal generation circuit 242, the ground potential control signal NSG shifts from LOW to HIGH. This activates the second NMOS transistor 241b of the DSG driver 241, turning the DSG potential to the ground potential VSS.

In the reference potential generation circuit 244, the PMOS transistor 244a is inactivated while the first NMOS transistor 244b is activated. The reference potential VREF2 is therefore short-circuited with the ground potential VSS. This inactivates the DSG level detection transistor 246 and thus stops the current supply from the DSG precharge circuit 245 to the DSG node.

As described above, the sense amplifier ground circuit 24 in this embodiment uses the DSG level detection transistor 246, in place of the DSG level detection circuit 235 of the sense amplifier ground circuit 23 in EMBODIMENT 1. The DSG level detection transistor 246 has a nature that the current drive ability thereof decreases as the DSG potential is closer to the predetermined potential VTN.

Further, the DSG level detection transistor 246 controls the amount of precharge current supplied from the DSG precharge circuit 245 to the DSG node. This prevents an occurrence of propagation delay from the detection of the DSG potential to the precharging, and thus minimizes wasteful consumption of precharge current.

The precharge current supplied to the DSG node changes in correspondence with the DSG potential in an analog fashion. This suppresses a change in the DSG potential, and thus reduces an occurrence of a variation in the charge amount accumulated in memory cells of the DRAM, compared with the sense amplifier ground circuit 23 in EMBODIMENT 1.

In this embodiment, the DSG level detection circuit 235 and the Schmitt trigger 236 in EMBODIMENT 1 are not necessary, allowing for reduction of the operating current of the sense amplifier ground circuit 24 and the layout size of the circuit. As a result, a low-power, highly-integrated DRAM is realized.

EMBODIMENT 4

Figure 14:
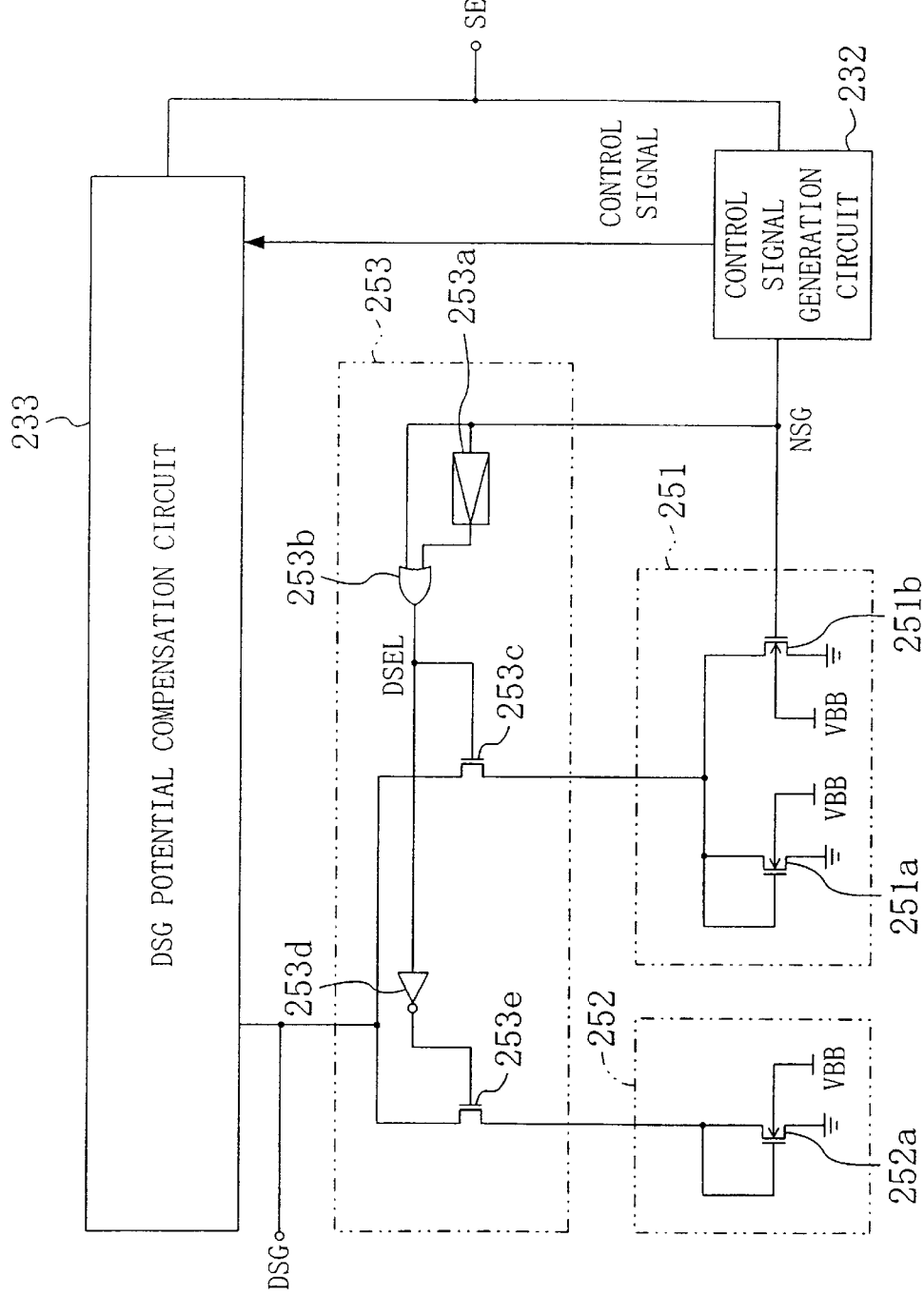
FIG. 14 is a circuit diagram of a sense amplifier ground circuit of a semiconductor memory device of EMBODIMENT 4 according to the present invention.

FIG. 14 shows a configuration of a sense amplifier ground circuit of the semiconductor memory device of EMBODIMENT 4 according to the present invention. Referring to FIG. 14, a sense amplifier ground circuit 25 includes: a DSG driver 251 and a DSG sub-driver 252 as the ground potential generation part and the threshold potential generation part for driving the dynamic sense amplifier ground (DSG) potential; a control signal generation circuit 232 as the ground potential control part; a DSG potential compensation circuit 233 as the potential compensation part; and a DSG driver switching circuit as the threshold potential generation semiconductor element selection means that receives a ground potential control signal NSG from the control signal generation circuit 232 and selects the DSG driver 251 or the DSG sub-driver 252. The control signal generation circuit 232 and the DSG potential compensation circuit 233 have the same configurations as those in EMBODIMENT 1.

The DSG driver 251 includes: a first NMOS transistor 251a as the first threshold potential generation semiconductor element having a gate and a drain commonly connected to an input terminal of the DSG driver switching circuit 253; and a second NMOS transistor 251b as the ground potential generation semiconductor element connected in parallel with the first NMOS transistor 251a for setting the output potential to the ground potential in response to a ground potential control signal NSG from the control signal generation circuit 232.

The DSG sub-driver 252 includes an NMOS transistor 252a as the second threshold potential generation semiconductor element having a gate and a drain commonly connected to another input terminal of the DSG driver switching circuit 253.

The DSG driver switching circuit 253 includes: a delay circuit 253a for adding a predetermined delay time to the ground potential control signal NSG from the control signal generation circuit 232; an OR circuit 253b receiving the ground potential control signal NSG at one input terminal and a delay signal from the delay circuit 253a at the other input terminal for outputting an internal selection signal DSEL; a first NMOS transistor 253c having a gate receiving the internal selection signal DSEL, a source receiving an output signal from the DSG driver 251, and a drain connected to the DSG node; an inverter 253d; and a second NMOS transistor 253e having a gate receiving the inverted internal selection signal DSEL via the inverter 253d, a source receiving an output signal from the DSG sub-driver 252, and a drain connected to the DSG node.

The back-gate potential VBB of about −1.0 V is applied to the substrates of the DSG driver 251 and the DSG sub-driver 252. The size of the NMOS transistor 252a of the DSG sub-driver 252 is smaller than that of the first NMOS transistor 251a of the DSG driver 251.

Hereinafter, the operation of the sense amplifier ground circuit 25 with the above configuration will be described.

Figure 15:
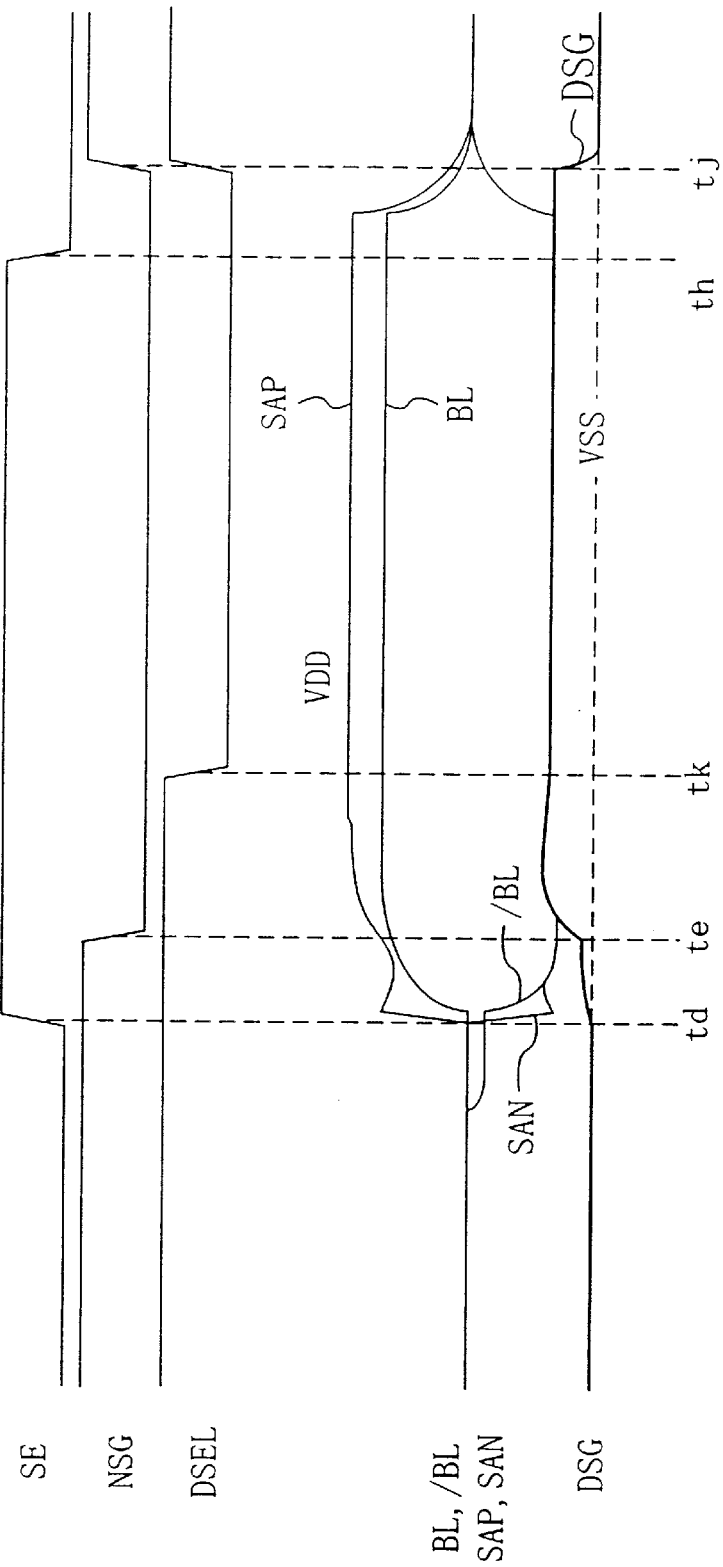
FIG. 15 is a timing chart of the sense amplifier ground circuit of the semiconductor memory device of EMBODIMENT 4.

FIG. 15 is a timing chart of the sense amplifier ground circuit 25 in this embodiment. In this embodiment, the configuration of the DRAM other than that of the sense amplifier 25 is substantially the same as that described in EMBODIMENT 1 with reference to FIG. 2.

During the period from the precharge period to time tk, the internal selection signal DSEL of the DSG driver switching circuit 253 is HIGH. The internal selection signal DSEL is a signal obtained by delaying the rising timing of the ground potential control signal NSG from the control signal generation circuit 232 shown in FIG. 14. Therefore, the first NMOS transistor 253c of the DSG driver switching circuit 253 is in the activated state, while the second NMOS transistor 253e thereof is in the inactivated state. As a result, the DSG node is electrically connected to the DSG driver 251 via the first NMOS transistor 253c. During this period, therefore, the DSG driver 251 performs the operation of short-circuiting the DSG potential with the ground potential VSS during the precharge period of the DRAM until time te and the operation of raising the DSG potential to a predetermined threshold potential by clamping during the period from time te to time tk.

At time te, the ground potential control signal NSG shifts from HIGH to LOW. At time tk after the lapse of a predetermined time generated by the delay circuit 253a of the DSG driver switching circuit 253 from time te, the internal selection signal DSEL shifts from HIGH to LOW. This inactivates the first NMOS transistor 253c of the DSG driver switching circuit 253 and activates the second NMOS transistor 253e thereof. As a result, the DSG node is electrically connected to the DSG sub-driver 252 via the second NMOS transistor 253e. At and after time tk, the DSG potential is stabilized at near the threshold potential VTN that is substantially the same as the threshold potential of the first NMOS transistor 251a of the DSG driver 251, and the low-level potential at the bit complementary line /BL is kept lowered at the level of the DSG potential.

In the above state, the amount of current flowing to the DSG sub-driver 252 from the DSG potential compensation circuit 233 or activated sense amplifiers decreases. Therefore, even the NMOS transistor 252a of the DSG sub-driver 252 that is smaller in size than the first NMOS transistor 251a of the DSG driver 251 can stabilize the DSG potential at near the threshold potential VTN.

At time tj, when both the internal control signal NSG and the internal selection signal DSEL shift from LOW to HIGH, the DSG node is electrically connected with the DSG driver 251 via the first NMOS transistor 253c of the DSG driver switching circuit 253. Also, at and after time tj, the DSG potential is short-circuited with the ground potential VSS via the second NMOS transistor 251b of the DSG driver 251.

Thus, as described above, the sense amplifier ground circuit 25 in this embodiment is provided with the DSG driver 251 and the DSG sub-driver 252 having different current drive abilities, as well as the DSG driver switching circuit 253 for selecting either one of the circuits 251 and 252. With the above configuration, the comparatively large-size transistor of the DSG driver 251 can be used during the period over which a large current flows to the DSG node such as immediately after time td at which the sense amplifier drivers are activated and immediately after time te at which the DSG potential compensation circuit 233 is activated to raise the DSG potential. This serves to suppress an excessive rise of the DSG potential and thus ensures stabilization of the DSG potential.

In the contrary, the DSG sub-driver 252 having the smaller transistor can be selected as the activated driver after the DSG potential and the potential at the low-potential one of the bit line pair BL, /BL have been stabilized at near the threshold potential VTN that is substantially equal to the threshold of the first NMOS transistor of the DSG driver 251 after time te at which the DSG potential compensation circuit 233 is activated. This serves to suppress lowering of the DSG potential due to a leak current via the DSG driver 251.

Thus, the sense amplifier ground circuit 25 in this embodiment can suppress lowering of the DSG potential due to a leak current during the period from time tf to time tj shown in FIG. 6. This reduces the precharge current consumption required for compensating the DSG potential. Therefore, power consumption of the DRAM can be reduced especially when the DRAM performs operations, such as paging, requiring comparatively long period of activating sense amplifiers.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device formed on a semiconductor substrate, comprising:
   a memory cell array having a plurality of memory cells formed at intersections between a plurality of word lines and a plurality of bit line pairs;
   a plurality of sense amplifiers each formed to correspond to each of the plurality of bit line pairs for amplifying a potential difference read on the bit line pair; and
   low-level potential generation means for generating a low-level potential, said low-level potential, along with a high-level potential, being applied to the memory cells, the bit line pairs, and the sense amplifiers,
   wherein the low-level potential generation means comprises:
      a ground potential generation part having a ground potential generation semiconductor element for generating as the low-level potential a first potential substantially equal to a ground potential;
      a threshold potential generation part having a threshold potential generation semiconductor element for generating as the low-level potential a second potential substantially equal to a threshold potential, and operating when a potential exceeding the threshold potential is applied; and
      a ground potential control part for controlling operation of the ground potential generation semiconductor element.

2. The device of claim 1, wherein the ground potential generation semiconductor element generates the first potential by being activated in response to a control signal from the ground potential control part and kept activated over a predetermined period starting from a time at which part of the plurality of sense amplifiers are activated, and
   the threshold potential generation semiconductor element generates the second potential during a period over which the ground potential generation semiconductor element is not activated.

3. The device of claim 1, wherein the ground potential generation semiconductor element generates the first potential by being activated in response to a control signal from the ground potential control part and kept activated during a period over which the plurality of sense amplifiers are in the inactivated state and over a predetermined period starting from a time at which part of the plurality of sense amplifiers are activated, and
   the threshold potential generation semiconductor element generates the second potential during a period over which the ground potential generation semiconductor element is not activated.

4. The device of claim 1, wherein the low-level potential generation means further includes:
   a reference potential generation part for generating a reference potential that is substantially equal to the threshold potential; and
   a potential compensation part for compensating the low-level potential by supplying a current so that the low-level potential is higher than the reference potential,
   wherein the reference potential generation part and the potential compensation part operate during a period over which the ground potential generation part is not activated.

5. The device of claim 4, wherein the ground potential generation part shifts from the activated state to the inactivated state when the potential at the low-potential bit line out of the bit line pair connected to an activated sense amplifier among the plurality of sense amplifiers is higher than the low-level potential.

6. The device of claim 4, wherein the potential compensation part includes current supply ability switching means for switching the current supply ability of the potential compensation part depending on the memory capacity of the memory cell array.

7. The device of claim 4, wherein the potential compensation part includes current supply ability switching means for switching the current supply ability of the potential compensation part depending on the number of sense amplifiers activated at one operation timing.

8. The device of claim 1, wherein the low-level potential generation means further includes:
   a reference potential generation part for generating a reference potential substantially twice as large as the threshold potential; and
   a potential compensation part for compensating the low-level potential by supplying a current so that the low-level potential is substantially equal to the threshold potential,
   wherein the potential compensation part includes a field effect transistor having a gate receiving the reference potential, a drain receiving a current from the potential compensation part, and a source outputting the low-level potential.

9. The device of claim 8, wherein the ground potential generation part shifts from the activated state to the inactivated state when the potential at the low-potential bit line out of the bit line pair connected to an activated sense amplifier among the plurality of sense amplifiers is higher than the low-level potential.

10. The device of claim 8, wherein the potential compensation part includes current supply ability switching means for switching the current supply ability of the potential compensation part depending on the memory capacity of the memory cell array.

11. The device of claim 8, wherein the potential compensation part includes current supply ability switching means for switching the current supply ability of the potential compensation part depending on the number of sense amplifiers activated at one operation timing.

12. The device of claim 1, wherein the threshold potential generation semiconductor element includes a first semiconductor element and a second semiconductor element, and
   the low-level potential generation means includes:
      a potential compensation part for compensating the low-level potential by supplying a current so that the low-level potential is higher than the ground potential; and threshold potential generation semiconductor element selection means for selecting the first semiconductor element or the second semiconductor element in response to a control signal from the ground potential control part.

13. The device of claim 12, wherein the second semiconductor element is smaller in size than the first semiconductor element, and the threshold potential generation semiconductor element selection means selects an output from the first semiconductor element during a given period starting from a time at which part of the plurality of sense amplifiers are activated, and selects an output from the second semiconductor element after lapse of the given period.

14. The device of claim 1, wherein a plural number of the memory cell arrays are arranged, a plurality of sense amplifier columns each including the plurality of sense amplifiers are placed so that the plurality of sense amplifiers are located along the sides of the plurality of memory cell arrays parallel to a direction in which the word lines extend, the plurality of memory cell arrays and the plurality of sense amplifier columns constitute a memory core block, and the low-level potential generation means are placed along both sides of the memory core block parallel to a direction in which the plurality of sense amplifier columns extend.

15. The device of claim 14, wherein the ground potential generation semiconductor element, the threshold potential generation semiconductor element, and semiconductor elements in the sense amplifier columns are formed in a common continuous well formed in the semiconductor substrate.

* * * * *